United States Patent
Yahata et al.

(10) Patent No.: US 7,082,063 B2
(45) Date of Patent: Jul. 25, 2006

(54) SEMICONDUCTOR MEMORY DEVICE

(75) Inventors: Hideharu Yahata, Inagi (JP); Masashi Horiguchi, Koganei (JP); Yoshikazu Saitoh, Hamura (JP); Yasushi Kawase, Tachikawa (JP)

(73) Assignees: Renesas Technology Corporation, Tokyo (JP); Hitachi Device Engineering Co., Ltd., Chiba-ken (JP)

( * ) Notice: Subject to any disclaimer, the term of this patent is extended or adjusted under 35 U.S.C. 154(b) by 0 days.

(21) Appl. No.: 11/168,291

(22) Filed: Jun. 29, 2005

(65) Prior Publication Data

US 2005/0237839 A1    Oct. 27, 2005

Related U.S. Application Data

(63) Continuation of application No. 10/636,558, filed on Aug. 8, 2003, now Pat. No. 6,928,017, which is a continuation of application No. 10/175,301, filed on Jun. 20, 2002, now Pat. No. 6,625,079.

(30) Foreign Application Priority Data

Aug. 8, 2001   (JP) ............................. 2001-241351

(51) Int. Cl.
*G11C 7/00*   (2006.01)
*G11C 8/00*   (2006.01)
(52) U.S. Cl. ................... 365/193; 365/233.5; 365/222; 365/238.5
(58) Field of Classification Search ................ 365/193, 365/222, 233.5, 238.5
See application file for complete search history.

(56) References Cited

U.S. PATENT DOCUMENTS

| | | | |
|---|---|---|---|
| 4,636,991 A * | 1/1987 | Flannagan et al. | 365/233.5 |
| 4,809,233 A | 2/1989 | Takemae | |
| 5,335,206 A | 8/1994 | Kawamoto | |
| 5,430,686 A | 7/1995 | Tokami et al. | |
| 5,566,129 A * | 10/1996 | Nakashima et al. | 365/233.5 |
| 6,392,958 B1 | 5/2002 | Lee | |
| 6,643,205 B1 * | 11/2003 | Kim | 365/222 |

FOREIGN PATENT DOCUMENTS

| | | |
|---|---|---|
| JP | 61-71494 | 9/1984 |
| JP | 1-94593 | 10/1987 |

* cited by examiner

*Primary Examiner*—Son T. Dinh
(74) *Attorney, Agent, or Firm*—Reed Smith LLP; Stanley P. Fisher, Esq.; Juan Carlos A. Marquez, Esq.

(57) ABSTRACT

With the objective of providing a semiconductor memory device which is made identical in usability to a static RAM by use of dynamic memory cells and realizes a high-speed memory cycle time, there is provided a pseudo static RAM having a time multiplex mode which, when instructions for a memory operation for reading memory information from each of memory cells each requiring a refresh operation for periodically holding the memory information, or writing the same therein is issued, carries out an addressing-based autonomous refresh operation different from the memory operation before or after the memory operation. The pseudo static RAM includes address signal transition detectors for a row and a column, and a page mode which independently performs a column address selecting operation according to an address signal transition detect signal of the second address signal transition detector.

6 Claims, 23 Drawing Sheets

SEMICONDUCTOR MEMORY DEVICE

This application is a Continuation application of U.S. application Ser. No. 10/636,558 filed Aug. 8, 2003, now U.S. Pat. No. 6,928,017 which is a Continuation application of U.S. application Ser. No. 10/175,301 filed on Jun. 20, 2002 now U.S. Pat. No. 6,625,079. Priority is claimed based upon U.S. application Ser. No. 636,558 filed on Aug. 8, 2003, which claims the priority date of U.S. application Ser. No. 10/175,301 filed on Jun. 20, 2002, which claims the priority date of Japanese Application No. 2001-241351 filed on Aug. 8, 2001, and which is hereby incorporated by reference.

BACKGROUND OF THE INVENTION

The present invention relates to a semiconductor memory device which needs a refresh operation, and principally to a technology effective for application to a pseudo static RAM or the like which executes an external read/write operation and a refresh operation executed by an internal circuit during one memory cycle to conceal the refresh operation from outside, thereby being usable equivalently to a static RAM (Random Access Memory) on an equivalent basis.

In order to make it possible to handle a DRAM in a manner similar to an SRAM (Static Random Access Memory), a so-called time multiplex type DRAM wherein a read/write operation and a refresh operation are executed during one cycle with their times being assigned thereto, or the two operations are executed only when the read/write operation and the refresh operation compete with each other, has been proposed in Unexamined Patent Publication No. Sho 61(1985)-71494 (Related Art 1). Further, a pseudo SRAM wherein address transition detectors for a row and a column are respectively provided and a static column operation is controlled based on these detected signals, has been proposed in Unexamined Patent Publication No. Hei 1(1989)-94593 (Related Art 2).

SUMMARY OF THE INVENTION

In the related art 1, no page read mode is disclosed. The related art 1 does not show architecture for performing switching to a high-speed sequential read mode when only a column address has changed. The related art 2 has a problem in that it corresponds to a page read mode but pays no consideration to the refresh operation, and when page read is done continuously, a word line remains activated and hence refresh cannot be performed, whereby the page read is restricted by the refresh operation.

An object of the present invention is to provide a semiconductor memory device which is made identical in usability to a static RAM by using dynamic memory cells and realizes a high-speed memory cycle time. The above, other objects and novel features of the present invention will become apparent from the description of the present specification and the accompanying drawings.

A summary of a typical one of the inventions disclosed in the present application will be described in brief as follows: A pseudo static RAM having a time multiplex mode which, when instructions for a memory operation for reading memory information from each of memory cells each requiring a refresh operation for periodically holding the memory information, or writing the same therein is issued, carries out an addressing-based autonomous refresh operation different from the memory operation before or after the memory operation, includes address signal transition detectors for a row and a column, and a page mode which independently performs a column address selecting operation according to an address signal transition detect signal of the column address signal transition detector.

DETAILED DESCRIPTION OF THE PREFERRED EMBODIMENTS

Figure 1:
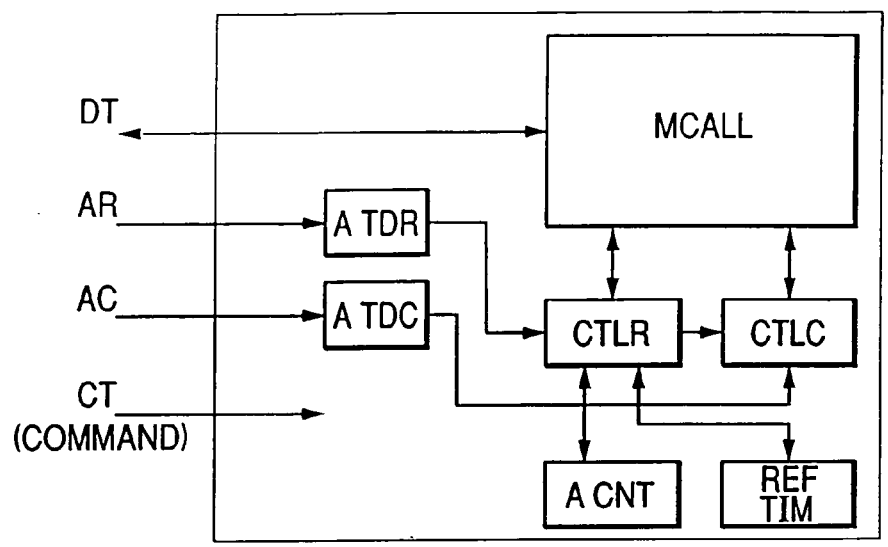
FIG. 1 is a simplified block diagram showing one embodiment of a semiconductor memory device according to the present invention.

A schematic block diagram showing one embodiment of a semiconductor memory device according to the present invention is shown in FIG. 1. In the semiconductor memory device showing the present embodiment, a memory circuit MCALL includes a plurality of memory cells which are provided so as to correspond to a plurality of bit lines and a plurality of word lines and each of which needs a refresh operation for periodically holding memory information therein. Each of the memories comprises, for example, an information storage capacitor and an address selection MOSFET. The gate of the address selection MOSFET is electrically connected to its corresponding word line, one of its source and drain paths is electrically connected to its corresponding bit line the other thereof is electrically connected to its corresponding storage node of the storage capacitor.

The bit lines are provided in pairs and connected to an input/output node of a sense amplifier comprising differential latch circuits. According to the operation of selecting each word line, each memory cell is connected to one of each bit line pair, and no memory cells are connected to the other thereof. The sense amplifier uses a precharge voltage for each bit line to which no memory cells are connected, as a reference voltage, and amplifies a small potential difference between the reference voltage and a read signal read onto each bit line pair to which the memory cells are connected, to a high and a low levels, and performs rewriting or reprogramming (or refresh operation) that the state of an electrical charge in the storage capacitor, which is in the process of being lost by the word line selecting operation, to the original stored state. Such a configuration can make use of the same one as the known dynamic type RAM.

In order to select the word and bit lines of the memory circuit MCALL, a row address transition detector ATDR and a column address transition detector ATDC are provided. The row address transition detector is supplied with a row address signal ADR, and the column address transition detector is supplied with a column address signal AC, respectively. A data signal DT may include write data inputted to the memory circuit MCALL and read data outputted from the memory circuit MCALL. A signal CT may include control signals such as signals for a write/read control operation, chip selection, etc.

A signal outputted from the row address transition detector ATDR is inputted to a row controller CTLR to generate a row pass timing and a column start timing. A signal outputted from the column address transition detector ATDC is inputted to a column controller CTLC to generate a column pass timing. Access to the memory circuit MCALL is executed according to the timings generated by the controllers CTLR and CTLC. Thus, when only the column address signal AC is transitioned, column independent control is enabled and hence an input/output operation in a page mode can be effected on the corresponding word line selected by a row address selecting operation antecedent to it.

In the dynamic type memory cells referred to above, an information charge held in each storage capacitor will be lost with the elapse of time. Thus, the dynamic type memory cell needs a refresh operation for performing a read operation before such an information charge is lost and restoring it to an original charge state. A refresh timer REFTIM forms a predetermined time signal corresponding to information holding capability of the memory cell. A signal outputted from the refresh timer REFTIM is inputted to the row controller CTLR where refresh for an address specified by a refresh address counter ACNT is executed. A count up of the refresh address counter ACNT is also executed.

The row controller CTLR performs control for detecting transition of an external row address signal AR, i.e., earlier one between the output signal of the row address transition detector ATDR and the output signal of the internal refresh timer REFTIM, thereby allowing either the ordinary or normal memory access or the refresh operation to be executed and allowing a non-execution operation to be carried out after its execution. Thus, even if the internal refresh operation and external access conflict with each other, no problem arises. Therefore, an external refresh request can be made unnecessary.

Figure 2:
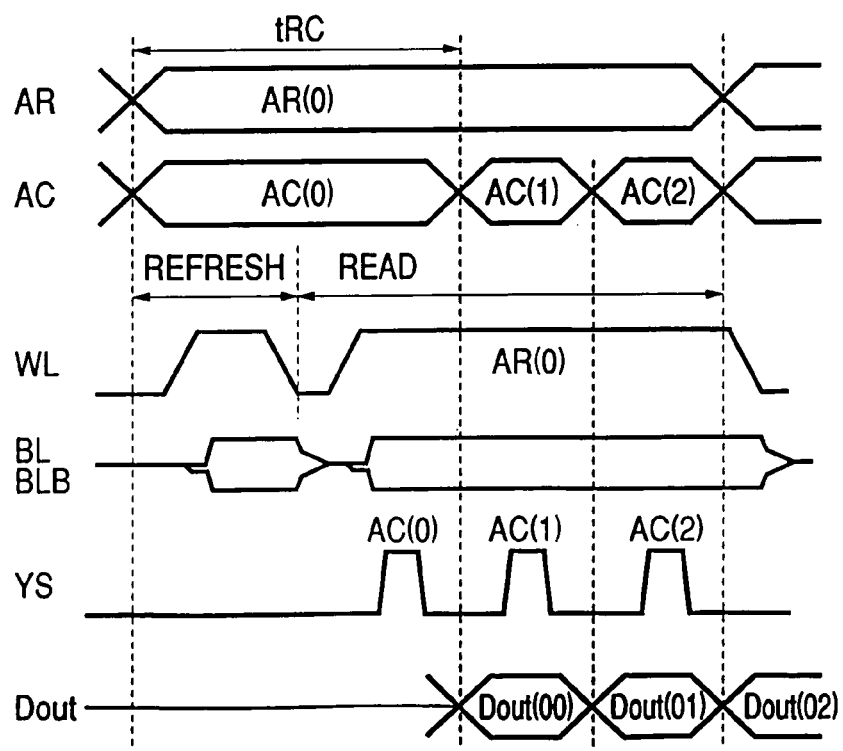
FIG. 2 is a simplified timing chart for describing one example of the operation of the embodiment shown in FIG. 1.

A simplified timing chart for describing one example of the operation of the embodiment shown in FIG. 1 is shown in FIG. 2. The same drawing shows an example in which an internal refresh request is detected earlier than the transition of an address signal AR. After the refresh operation, i.e., after a bit line pair BL and BLB is changed to a high level and a low level according to information stored in each memory cell under the selection of a word line WL by Refresh and the operation of a sense amplifier, and hence such a refresh operation as described above is executed, the word line WL is temporarily brought to a non-selected state of a low level and hence the bit line pair BL and BLB is reset (precharged). The operation (Read) of selecting a word line WL corresponding to an address signal AR (0) is performed to form a column select signal YS (AC(0)) in association with the address signal AC(0).

Such a refresh operation and a read operation start are executed within one cycle (tRC). As a result, the internal refresh operation is not recognized from outside. Thus, the external refresh request becomes unnecessary, and an SRAM interface swap or exchange can be realized while using the memory circuit MCALL comprising the above dynamic type memory cells.

Figure 3:
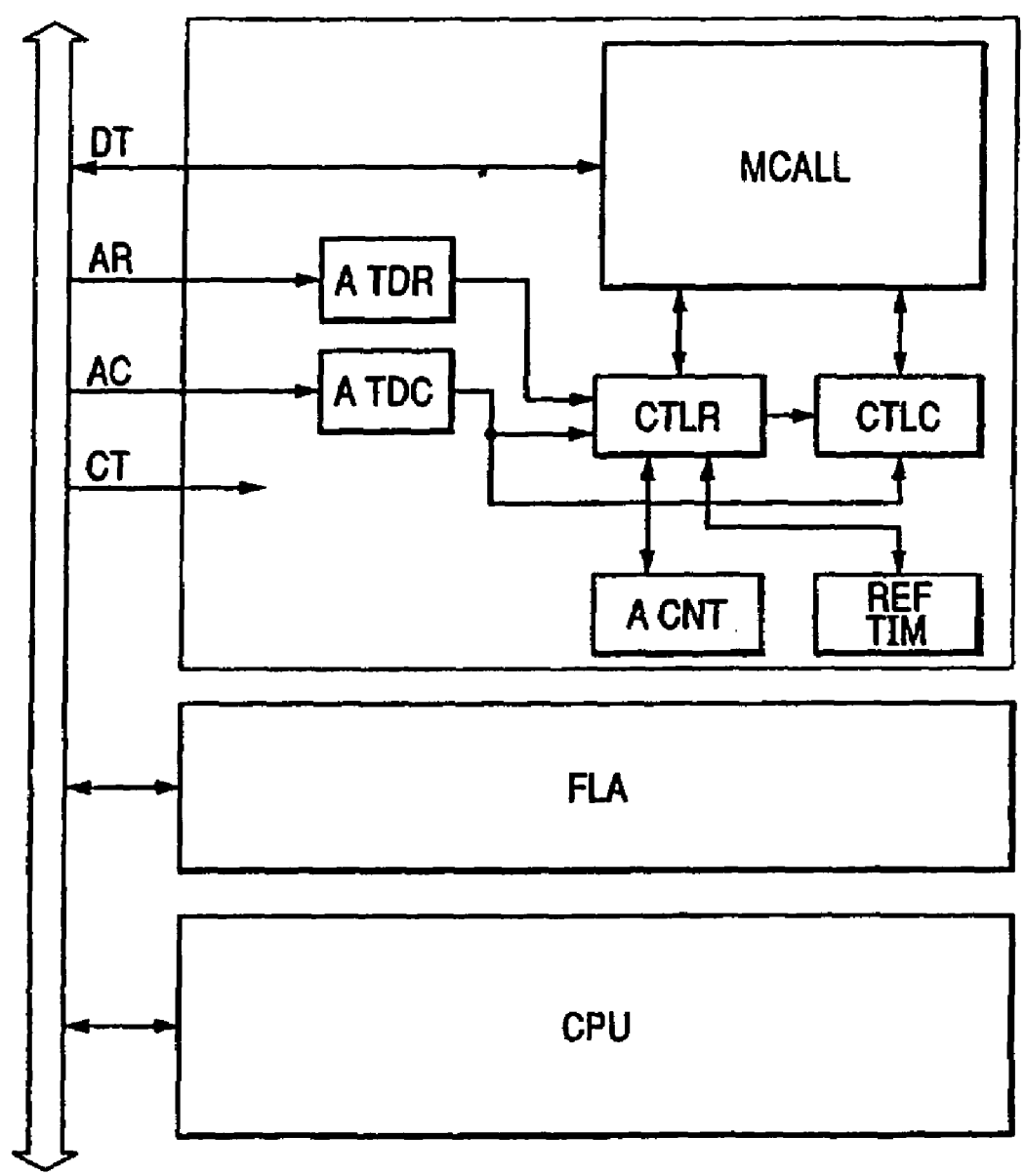
FIG. 3 is a simplified block diagram illustrating one embodiment of a system using a semiconductor memory device according to the present invention.

When a read signal Dout(0) based on the column select signal YS (AC(0) corresponding to the column address signal AC(0) is outputted after one cycle (tRC), and only a column address signal (AC) changes (AC(0)→AC(1)), a column select signal YS (AC(1)) associated with a page address is formed while a word line WL remains activated (held in a selected state), whereby data Dout(01) is read. Thereafter, when only the column address signal AC changes again (AC(1)→AC(2)), a column system using a semiconductor memory device according to the present invention is shown in FIG. 3. The system showing the present embodiment comprises a central processing unit CPU made up of a microprocessor or the like, a non-volatile memory FLA and the semiconductor memory device (pseudo static RAM) according to the present invention. These are interconnected with one another via a system bus.

In the semiconductor memory device according to the present embodiment, part (other than a page address) of the output of the column address transition detector ATDC is inputted to the row controller CTLR and the column controller CTLC from which a row pass timing and a column start timing, and a column pass timing are generated. Upon activation of a word line WL, part (page address) of the output of the column address transition detector ATDC is inputted to the column controller (CTLC) from which a column pass timing is generated. Thus, when only the page address is transitioned, column independent control is allowed so as to cope with a page mode. The present device is similar to FIG. 2 in operating timing.

The system equipped with the pseudo SRAM is shown together in the present embodiment. The CPU supplies the address signals AR, AC and CT to the system bus and obtains access to the pseudo static RAM to read data therefrom, thereby extracting the data via the system bus. When data are fetched out sequentially at this time, the CPU changes the column address signal AC alone and thereby makes it possible to fetch the data from the pseudo SRAM sequentially in response to the change in address signal AC. In reverse, the CPU supplies the address signals AR, AC and CT and write data DT to the system bus and obtains access to the pseudo static RAM, thereby making it possible to fetch the write data as well. The write data can also be processed in the page mode at high speed.

Since a refresh operation of a dynamic memory cell is autonomously performed in the pseudo static RAM as described above, the CPU may control only a read/write operation with respect to the pseudo static RAM. Since the read operation or the write operation and the refresh operation are adjusted thereinside even when they compete with one another, it becomes unnecessary to externally take the refresh operation into any consideration. Therefore, the pseudo static RAM can be handled as one which is completely the same as the static RAM from outside.

Although not restricted in particular, the flash memory FLA serves so as to hold data requiring non-volatilization, of data recorded in the pseudo static RAM. Namely, when no access to the pseudo static RAM is performed at power-off or over a long time, the data that needs non-volatilization, of the data recorded in the pseudo static AM according to instructions issued from the CPU or the like, is transferred to and held in the flash memory FLA. Afterwards, the pseudo static RAM is power off.

Although the pseudo static RAM according to the present embodiment can be handled as substantially equivalent to the static RAM as described above in terms of the memory access, the refresh operation is always performed at predetermined cycles as distinct from the static RAM when no memory access is done, thereby allowing relatively large consumption current to flow. In order to avoid such a drawback, the pseudo static RAM is utilized in combination with the flash memory FLA to thereby make it possible to reduce current consumption at the time that no memory access is done over the long time. Such a combination with the flash memory FLA is similar even in the case of the embodiment shown in FIG. 1 and semiconductor memory devices showing other modifications to be described later.

Figure 4:
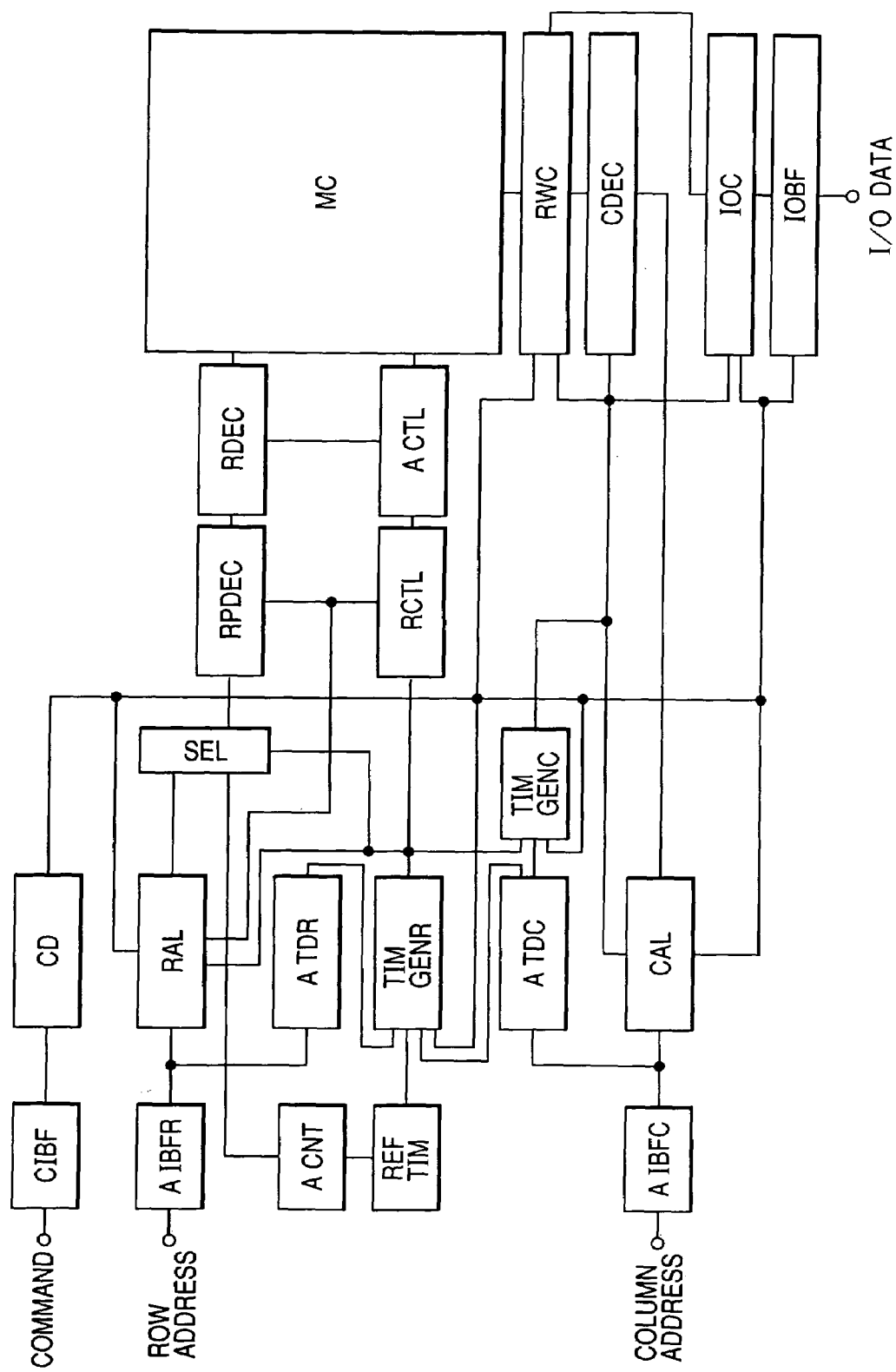
FIG. 4 is a block diagram depicting one embodiment of a semiconductor memory device according to the present invention.

A block diagram showing one embodiment of a semiconductor memory device according to the present invention is shown in FIG. 4. The same block diagram is associated with the embodiment shown in the schematic block diagram of FIG. 3. CIBF indicates a command input buffer. An input signal Command corresponds to each of the read/write control signal, chip select signal, etc. CD indicates a command decoder which decodes the input signal Command to discriminate or determine an operation mode for a memory. AIBFR indicates a row address input buffer which takes in or captures a row address signal Row Address (above AR). The captured address signal is held by a row address latch RAL.

SEL indicates a normal/refresh pass selector. An address signal selected through such a selector SEL is transferred to a row predecoder RPDEC. RDEC indicates a row decoder, which produces or forms a signal for selecting each word line in a memory circuit MC according to the output signal of the predecoder RPDEC. RCTL indicates a row controller, and ACTL indicates an array controller. ATDR indicates a row address transition detector, which detects the transition of the row address signal inputted via the row address buffer AIBFR. ACNT indicates a refresh address counter, and REFTIM indicates a refresh timer. TIMGENR indicates a row pas timing generator, which forms timing signals necessary for the address latch RAL, selector SEL and row controller RCTL.

AIBFC indicates a column address input buffer, which receives a column address signal Column Address (above AC) therein and allows a column address latch CAL to hold the captured address signal. ATDC indicates a column address transition detector, which detects the transition of the address signal inputted via the column address input buffer AIBFC. TIMGENC indicates a column pass timing generator. MC indicates the main circuit which includes memory cells, a sense amplifier and word drivers. RWC includes a main amp/write buffer and their control circuits. A column decoder CDEC decodes the address signal outputted from the address latch CAL to form a signal for selecting each bit line in the memory circuit MC. Although not restricted in particular, IOC indicates an input/output register, and IOBF indicates an input/output buffer.

In the present embodiment, when a row address is caused to transition, an output produced from the row address transition detector ATDR is inputted to the row pass timing generator TIMGENR from which a row pass timing and a column start timing are generated. When a column address other than a page address is transitioned, an output produced from the column address transition detector ATDC is inputted to the row pass timing generator TIMGENR from which a row pass timing and a column start timing are generated. When a page address in a column address is transitioned upon deactivation of a WL, an output produced from ATDC is inputted to TIMGENR where a row pass timing and a column start timing are generated.

When the page address in the column address (AC) is transitioned upon activation of the corresponding word line WL in the memory circuit MC, an output produced from the column address transition detector ATDC is inputted to the column pass timing generator TIMGENC where a column pass timing is generated. Thus, when only the page address is transitioned, column independent control is enabled, thereby making it possible to cope with a page mode.

An output produced from the refresh timer REFTIM is inputted to the address counter ACNT, where a refresh address is counted up. Further, the output of the refresh timer REFTIM is inputted even to the row pass timing generator TIMGENR and used for making a decision as to either a normal operation or a refresh operation. The row pass timing generator TIMGENR performs control for detecting early one of the outputs of the row address transition detector ATDR or the column address transition detector ATDC and the refresh timer REFTIM except for the generation of the row timing and the column start timing to thereby execute either the normal access or the refresh operation and thereafter execute an unexecuted operation. Thus, no problem arises even if an internal refresh operation and external access compete with each other, an external refresh request can be made unnecessary.

The selector SEL may be placed between the row decoder RDEC and the memory circuit MC and the array controller ACTL and the memory circuit MC. Alternatively, the selector SEL may be disposed between the row predecoder RPDEC and the row controller RCTL and between the row decoder RDEC and the array controller ACTL. Namely, this resides in the difference between the in-parallel selection of a word line for the normal operation and a word line for the refresh operation up to the predecoder RPDEC and the in-parallel selection thereof up to the row decoder RDEC. Although the operations of selecting the word lines in the normal operation and the refresh operation during one cycle can be made fast where decoding is done up to the subsequent stage side in this way, a circuit scale increases.

Figure 5:
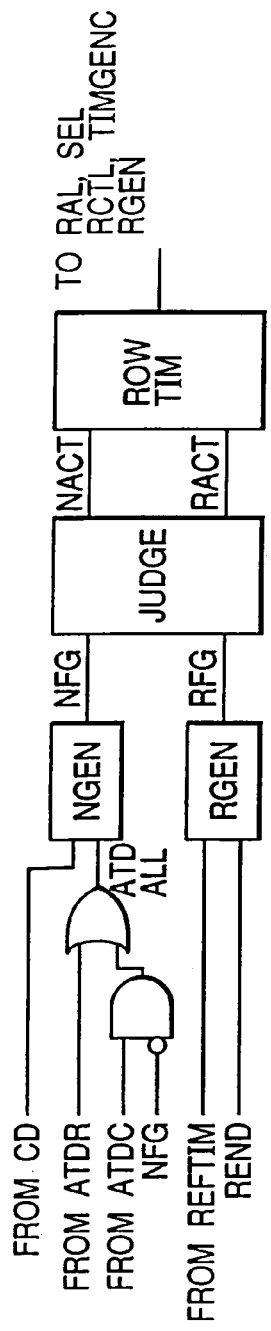
FIG. 5 is a block diagram showing one embodiment of a row pass timing generator TIMGENR.

A block diagram showing one embodiment of the row pass timing generator TIMGENR in FIG. 4 is shown in FIG. 5. A normal operation flag generator NGEN produces a normal operation flag signal NFG. The normal operation flag generator NGEN is set by the command CD such as the chip select signal and the output signal of the row address transition detector ATDR or the output signal of the column address transition detector ATDC (upon deactivation of word line WL, i.e., when signal NFG=low level), and reset by the command CD such as the chip select signal and the output signal of the row address transition detector ATDR or the output of the column address transition detector ATDC (upon activation of word line WL, i.e., when NFG=high level).

A refresh operation flag generator RGEN produces a refresh operation flag signal RFG. The refresh operation flag generator RGEN is set by the output of the refresh timer REFTIM and reset by a refresh end signal REND. The signal REND is a signal outputted from a circuit in which a time interval during which refresh can fully be executed from the beginning of the refresh operation, is achieved by a delay circuit or the like.

A judgement circuit JUDGE detects earlier one between the normal operation flag signal NFG and the refresh operation flag signal RFG and outputs any one of an normal operation active signal NACT and a refresh operation active signal RACT. When the refresh operation flag signal RFG is earlier than it for example, the judgement circuit JUDGE outputs the refresh operation active signal RACT to start a refresh operation. After the completion of the refresh operation, the signal REND is outputted and hence the refresh operation flag signal RFG is reset and the refresh operation active signal RACT is also reset.

Thereafter, the normal operation active signal NACT is outputted to execute the normal operation. The judgement circuit JUDGE eliminates the simultaneous activation of the normal operation active signal NACT and the refresh operation active signal RACT so that the refresh operation and the normal operation do not overlap each other. As a result, since no problem arises even if the internal refresh operation and the external access compete with each other, the external refresh request can be made unnecessary. ROWTIM indicates a row timing generator which produces a row pass operation timing and a column start timing.

Figure 6:
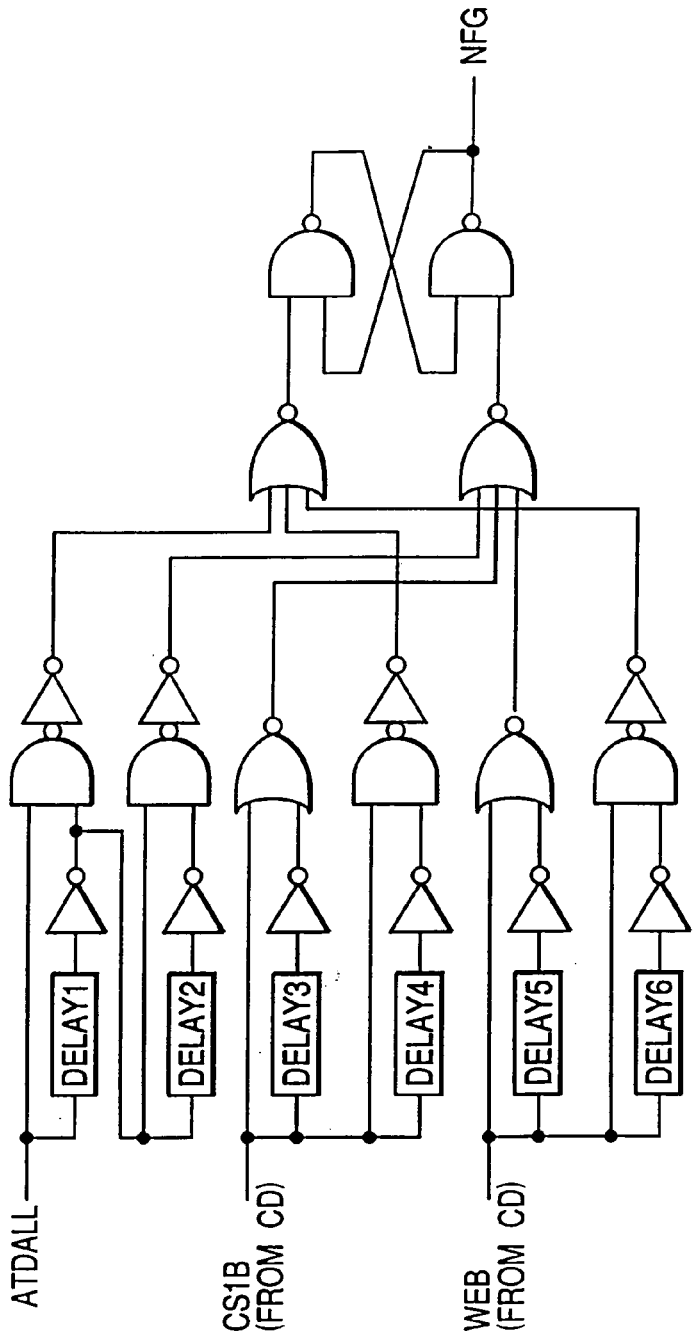
FIG. 6 is a circuit diagram illustrating one embodiment of a normal operation flag generator NGEN in FIG. 5.

A circuit diagram of one embodiment of the normal operation flag generator NGEN in FIG. 5 is shown in FIG. 6. The normal operation flag generator NGEN generates a one-shot pulse in response to the rising edge of a signal ATDALL generated via an OR gate since the address transition and resets a normal flag signal NFG of a latch made up of NAND gates. Further, the normal operation flag generator NGEN delays the signal ATDALL through the use of a delay DELAY1 and thereafter generates a one-shot pulse in response to the falling edge to thereby reset the normal flag signal NFG of the latch. Namely, the normal flag signal NFG is set with a delay by an amount delayed by the DELAY1 after the above resetting. This delay time is determined so that bit-line equalize (precharge, which is hereinafter used similarly) subsequent to the falling of a word line WL is kept in time for the next operation.

When the chip select signal CS1B is brought to a low level (chip select state), the normal flag signal NFG is set. When the chip select signal CS1B is brought to a high level (chip disable), the normal flag signal NFG is reset. When a write enable signal WEB is brought to a low level, the normal flag signal NFG is set. When the write enable signal WEB is brought to a high level, the normal flag signal NFG is reset. While the set/reset for the normal operation is defined by the address transition, the commands such as CS1B, WEB, or an operation control signal, the circuit showing the present embodiment can be applied even to other specs.

Figure 7:
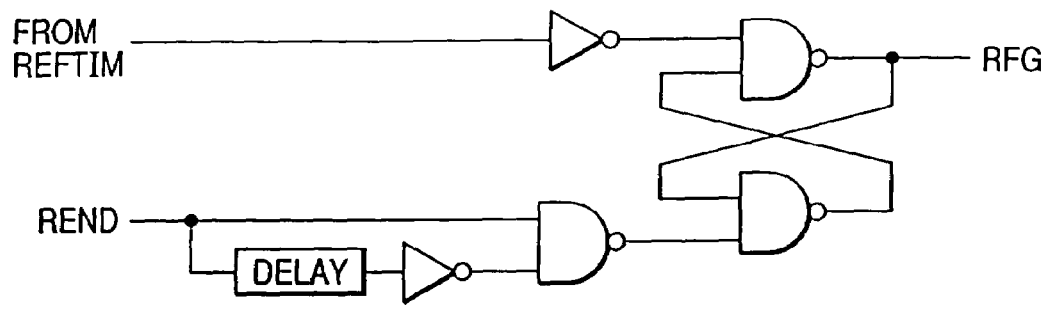
FIG. 7 is a circuit diagram depicting one embodiment of a refresh operation generator RGEN in FIG. 5.

A circuit diagram of one embodiment of the refresh operation flag generator RGEN in FIG. 5 is shown in FIG. 7. A refresh flag signal RFG formed by a latch comprising NAND gates is set according to the output (one-shot pulse) of the refresh timer REFTIM. The refresh flag signal RFG formed by the latch is reset in response to the rising edge of the refresh operation end signal REND. A delay, an inverter and an NAND gate produce a one-shot pulse at the rising edge of the refresh operation end signal REND to thereby reset the refresh flag signal RFG.

Figure 8:
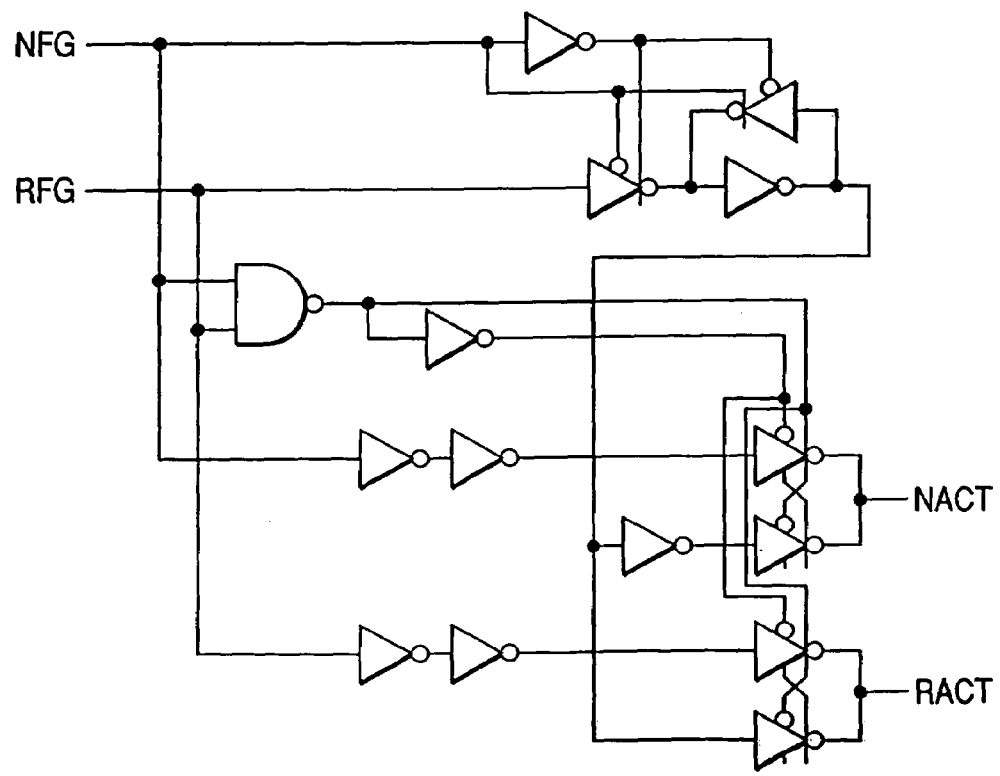
FIG. 8 is a circuit diagram showing one embodiment of a judgement circuit JUDGE in FIG. 5.

A circuit diagram showing one embodiment of the judgement circuit JUDGE in FIG. 5 is shown in FIG. 8. The judgement circuit JUDGE detects which one of the refresh flag signal RFG and the normal flag signal NFG rises precedently. When the normal flag signal NFG has risen precedently, the judgement circuit JUDGE outputs a normal operation active signal NACT. When the refresh flag signal RFG has risen precedently, the judgement circuit JUDGE outputs a refresh operation active signal RACT. The signals NACT and RACT are not outputted together.

When any of the signals NFG and RFG has risen, the states per se of the signals NFG and RFG are outputted as signals NACT and RACT by their corresponding selectors. On the rising edge of the signal NFG, the state of RFG is latched in its corresponding through latch. When the signals RFG and NFG rise together, the judgement circuit JUDGE outputs the values latched in the through latches respectively.

Now consider where the signal RFG rises antecedent to the signal NFG. In an initial state, RACT=RFG=low level, NACT=NFG=low level. When the signal RFG rises, the signals RACT=RFG=high level, and NACT=NFG=low level. When the signal NFG rises, the state of the signal RFG is latched in the through latch. Further, the latched state is outputted through the selector, and RACT=high level and NACT=low level are held. Thereafter, when the signal RFG falls in response to a refresh end signal REND, RACT=RFG=low level and NACT=NFG=high level are achieved by the selectors. As a result, it is understood that the above desired operations can be realized by the circuit showing the present embodiment.

Figure 9:
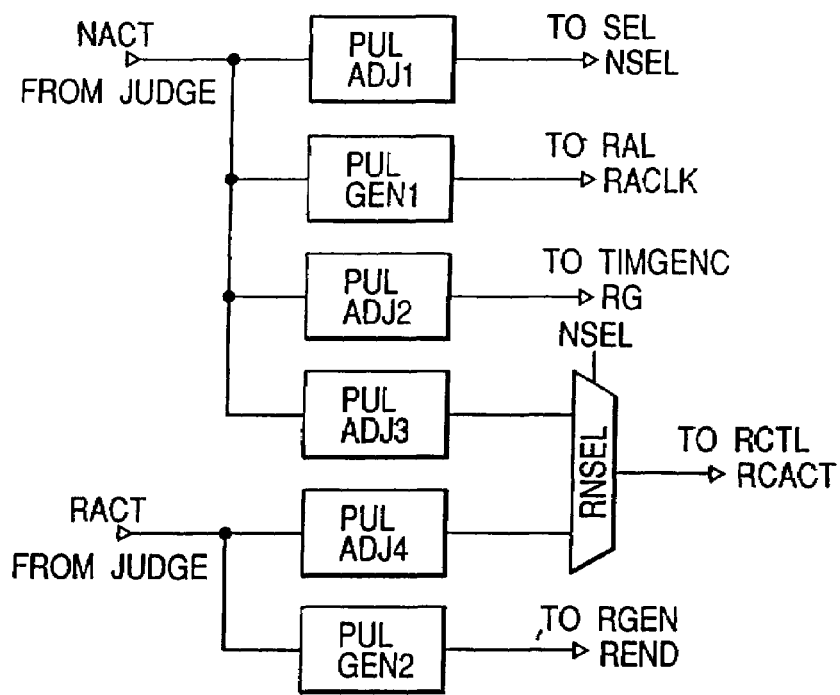
FIG. 9 is a block diagram illustrating one embodiment of a row pass timing generator ROWTIM in FIG. 5.

A block diagram showing one embodiment of the row pass timing generator ROWTIM in FIG. 5 is shown in FIG. 9. A pulse width adjuster PULADJ1 produces a refresh/normal select signal NSEL from the normal operation active signal NACT. A one-shot pulse generator PULGEN1 produces a row address latch signal RACLK from the signal NACT. A pulse width adjuster PULADJ2 generates a column pass start signal RG from the signal NACT.

A selector RNSEL selects either a row pass timing signal generated by a pulse width adjuster PULADJ3 from the signal NACT or a row pass timing signal generated by a pulse width adjuster PULADJ4 from the refresh operation active signal RACT and outputs a row active signal RCACT to the row controller RCTL. A one-shot pulse generator PULGEN2 produces a refresh operation end signal REND from the refresh operation active signal RACT.

Figure 10:
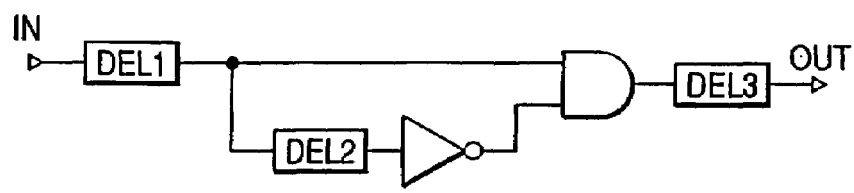
FIG. 10 is a circuit diagram depicting one embodiment of a one-shot pulse generator PULGENI in FIG. 9.

A circuit diagram showing one embodiment of the one-shot pulse generator PULGEN1 in FIG. 9 is shown in FIG. 10. An input signal IN and its inverted delay signal are supplied to an AND gate, where a one-shot pulse is formed. The width of the one-shot pulse is determined according to the value of a delay time interval of a delay DEL2. Delays DEL1 and DEL3 are used for timing adjustments. The pulse width adjusters PULADJ1 through PULADJ4 can also be created in a manner similar to the one-shot pulse generator PULGEN1.

Figure 11:
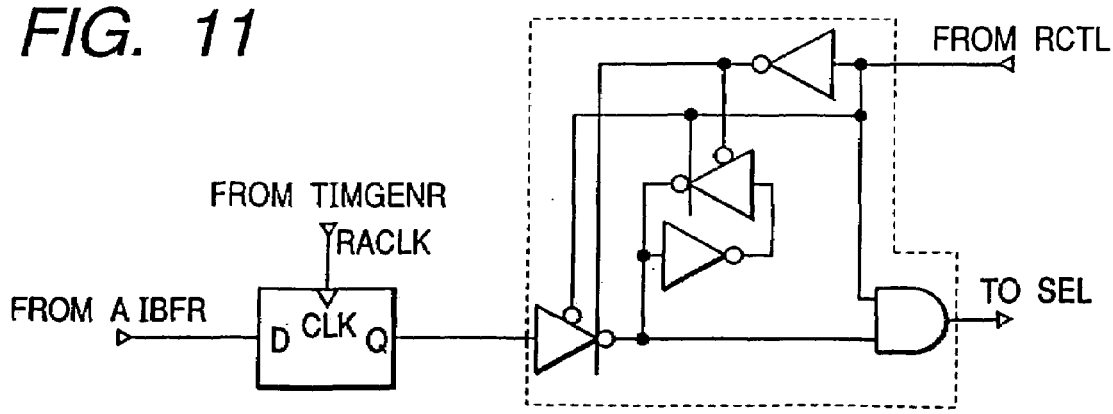
FIG. 11 is a circuit diagram showing one embodiment of a row address latch RAL in FIG. 4.

A circuit diagram showing one embodiment of the row address latch RAL in FIG. 4 is shown in FIG. 11. A flip-flop circuit latches an external row address captured through the row address input buffer AIBFR according to a clock signal RACLK. When a row pass is rendered active in response to an active signal sent from the row controller RCTL, the latched address is outputted via a through latch provided at an output portion of the row address latch RAL. Further, the address signal is latched in the through latch even by such an active signal. The selector SEL FIG. 4 may be disposed between the latch responsive to the timing signal RACLK and the through latch responsive to the active signal.

Figure 12:
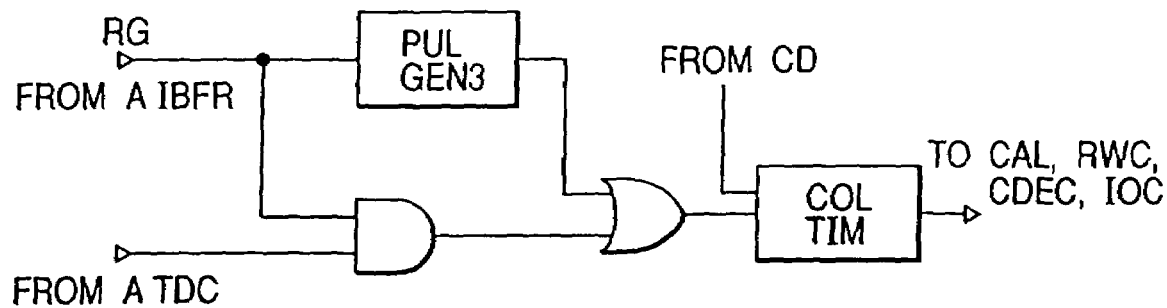
FIG. 12 is a circuit diagram illustrating one embodiment of a column pass timing generator TIMGENC in FIG. 4.

A circuit diagram showing one embodiment of the column pass timing generator TIMGENC in FIG. 4 is shown in FIG. 12. When a column start signal RG is enabled, a pulse is generated by a one-shot pulse generator PULGEN3 and inputted to a column timing generator COLTIM. The column timing generator COLTIM generates and outputs a start signal, etc. for each column circuit. Since the column timing generator COLTIM is similar to the row timing generator ROWTIM in configuration, the description thereof is omitted.

When a column address (page address) changes where the signal RG is in an enable state, a signal outputted from the column address transition detector ATDC is inputted to the column pass timing generator COLTIM, whereby a column circuit is started up. Thus, such a processing is capable of coping with a page mode. Even when the output of the column address transition detector ATDC changes when the signal RG is disabled, the gate of an AND gate is closed according to the disable of the signal RG, so that the output of the column address transition detector is not inputted to the column pass timing generator COLTIM. Therefore, the column circuit does not malfunction.

Figure 13:
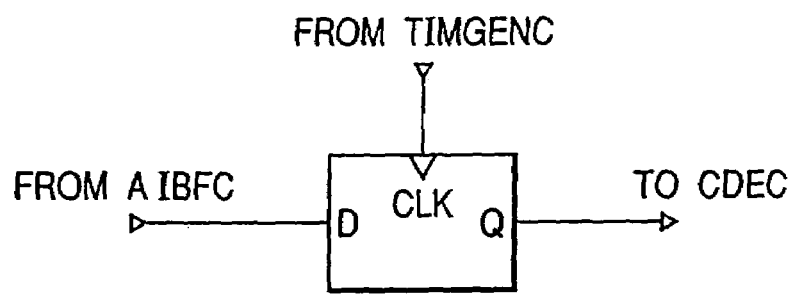
FIG. 13 is a circuit diagram depicting one embodiment of a column address latch CAL in FIG. 4.

A circuit diagram showing one embodiment of the column address latch CAL in FIG. 4 is shown in FIG. 13. The column address latch CAL comprises a flip-flop circuit and latches therein an external address signal inputted via the column address input buffer AIBFC in response to a clock signal generated from the column pass timing generator TIMGENC.

Figure 14:
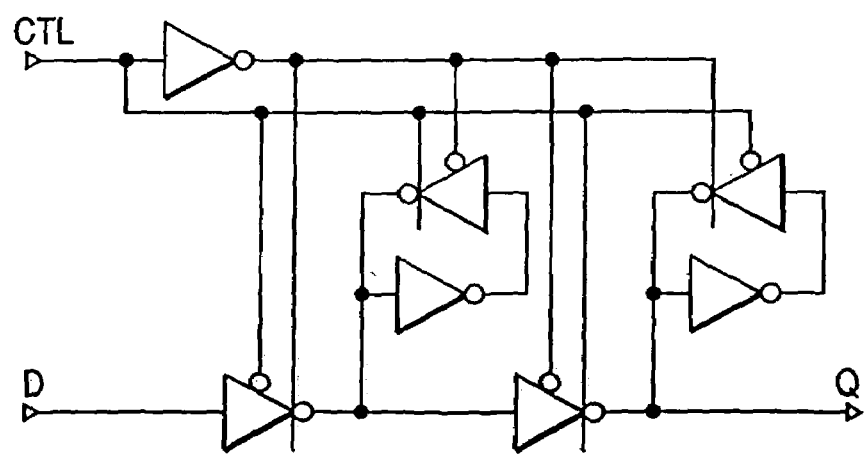
FIG. 14 is a circuit diagram showing one embodiment of a flip-flop (latch) circuit shown in each of FIGS. 11 and 13.

A circuit diagram showing one embodiment of the flip-flop (latch) circuit shown in each of FIGS. 11 and 13 is shown in FIG. 14. The flip-flop circuit showing the present embodiment includes two through latches connected in tandem. During a period in which a clock signal CLK is low in level, a pre-stage circuit is brought to a through state to thereby take in or capture an input signal D. At this time, a subsequent-stage circuit holds the captured data therein and outputs it therefrom. When the clock signal changes from a low level to a high level, the input side is brought to a data holding state, and the output side is brought to a through state. Thus, the flip-flop circuit performs a data output corresponding to the captured input signal D.

Figure 15:
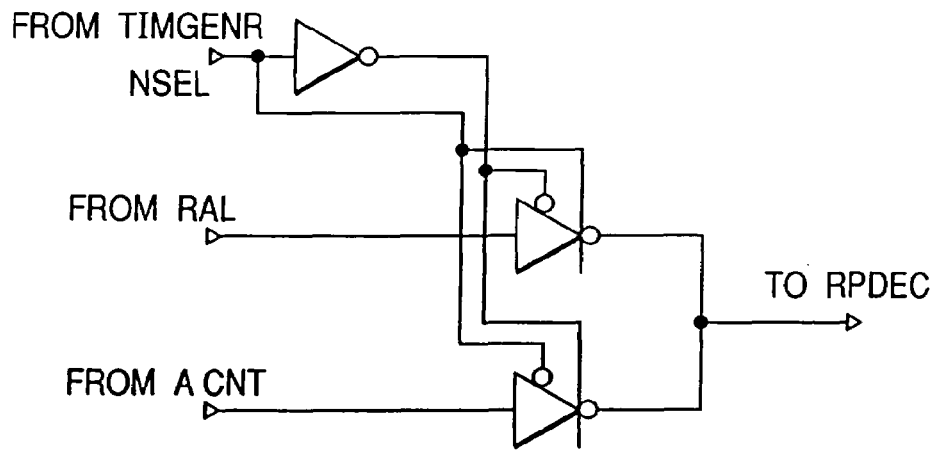
FIG. 15 is a circuit diagram illustrating one embodiment of a selector SEL in FIG. 4.

A circuit diagram showing one embodiment of the selector SEL in FIG. 4 is illustrated in FIG. 15. In the selector SEL according to the present embodiment, the outputs of two clocked inverters that receive an output signal of RAL and an output signal of ACNT therein, are commonly connected to obtain an output signal. When a signal NSEL from the row pass timing generator TIMGENR is high in level, the selection of a normal operation pass is performed. Namely, the clocked inverter that receives the address signal held in the row address latch RAL, is brought to an operating state to thereby supply the corresponding address signal to the row predecoder RPDEC. When the NSEL is low in level, a refresh operation pass is selected. Namely, the clocked inverter that receives therein the address signal generated by the address counter ACNT, is brought to an operating state to supply the corresponding address signal to the row predecoder RPDEC.

Figure 16:
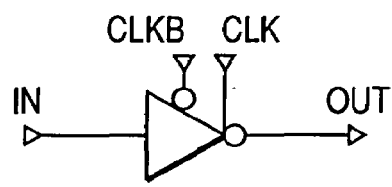
FIG. 16 is a diagram for describing a circuit symbol of a clocked inverter.

A circuit symbol indicative of the clocked inverter is illustrated in FIG. 16. When a complementary clock signal CLKB is low in level and CLK is high level, the clocked inverter is brought to an operating state to thereby invert an input signal IN and output it from an output terminal OUT. When the complementary clock signal CLKB is high in level and CLK is low in level, the clocked inverter is brought to an output high impedance state to thereby stop the transfer of the input signal IN.

Figure 17:
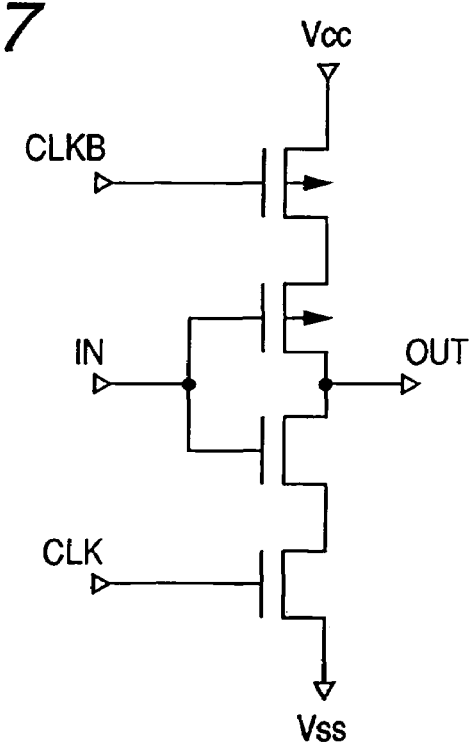
FIG. 17 is a circuit diagram showing one embodiment of the clocked inverter.

A circuit diagram showing one embodiment of the clocked inverter is illustrated in FIG. 17. In the present embodiment, P channel MOSFETs and N channel MOSFETs provided two by two are connected in a series form. One gates of the P channel MOSFET and the N channel MOSFET are respectively supplied with an input signal IN, whereas the others of the P channel MOSFET and the N channel MOSFET are respectively supplied with clock signals CLKB and CLK. An output signal OUT is obtained from a point where the P channel MOSFET and N channel MOSFET are connected to each other. Even when a CMOS switch is provided at an output portion of a CMOS inverter and switch-controlled by the clock signals CLKB and CLK as an alternative to the above configuration, a similar operation can be carried out.

Figure 18:
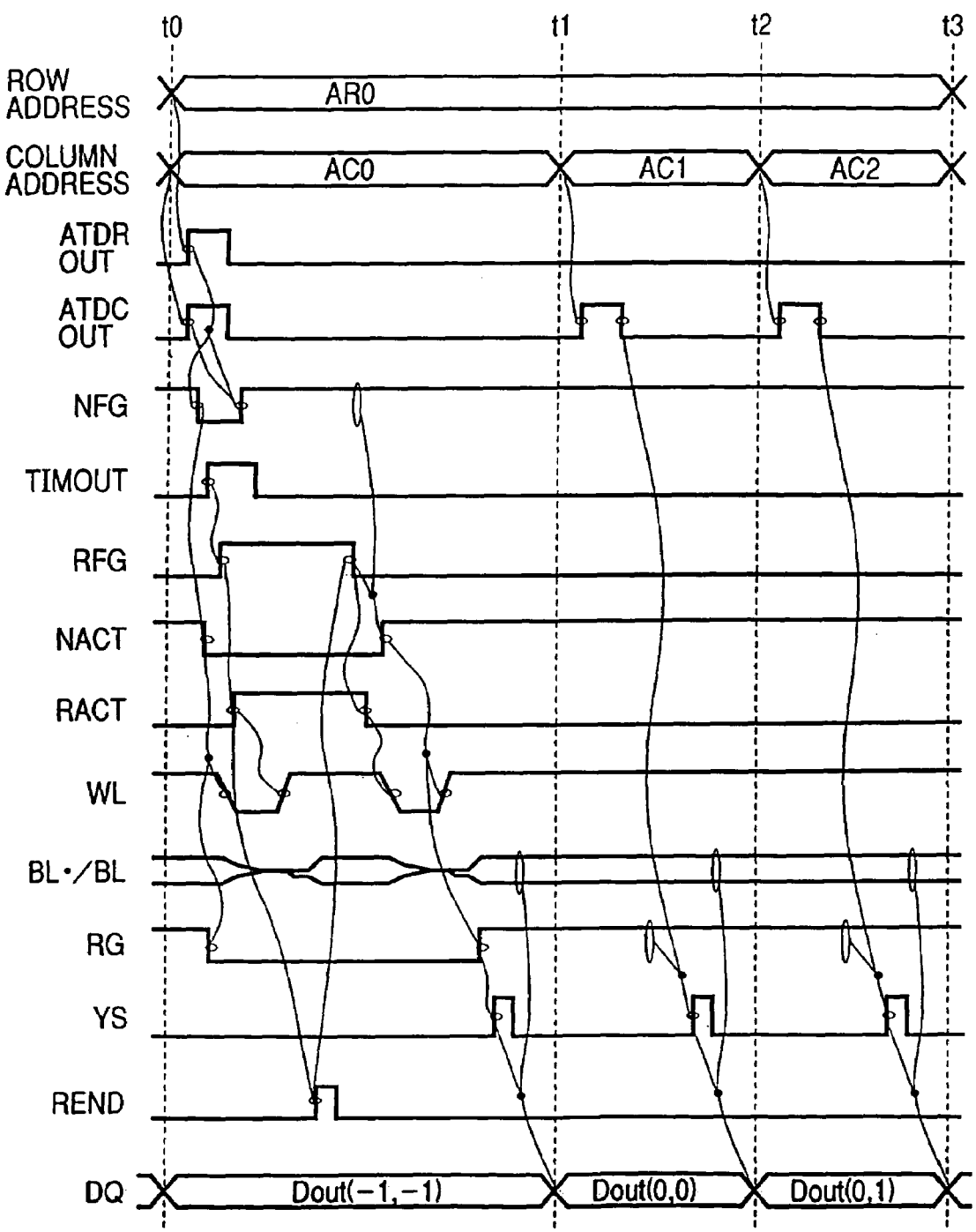
FIG. 18 is a timing chart for describing one example of the operation of the embodiment shown in FIG. 4.

A timing chart for describing one example of the operation of the embodiment shown in FIG. 4 is illustrated in FIG. 18. The same drawing shows an example of a page read timing chart (1) according to the present invention. When an external row address and a column address change to AR0 and AC0, respectively, at a time t0, their corresponding output signals ATDROUT and ATDCOUT of the row address transition detector ATDR and the column address transition detector ATDC are outputted in response to the changes referred to above.

The row address transition detect signal ATDROUT is inputted to the normal operation flag generator NGEN of the row pass timing generator TIMGENR, where a normal flag signal NFG and a normal operation active signal NACT are reset. Thereafter, the normal flag signal NFG is set again.

When an output signal TIMOUT of the refresh timer REFTIM is outputted, the output signal TIMOUT is inputted to the refresh operation flag generator RGEN of the row pass timing generator TIMGENR, where a refresh flag signal RFG is set. Since the refresh flag signal RFG rises earlier than the normal flag signal NFG in the present timing chart, a refresh operation active signal RACT is outputted. In response to the output of the refresh operation active signal RACT, each word line WL in the memory circuit MC is raised so that a refresh operation is executed.

A refresh end signal REND is generated based on a delay signal obtained from the refresh operation active signal RACT. This delay time is set to a time interval necessary for the refresh operation. According to the refresh end signal REND, the refresh flag signal RFG, the refresh operation active signal RACT and the word line WL are reset and the corresponding bit lines BL are equalized.

When the refresh operation active signal RACT falls, the normal operation active signal NACT rises in response to the output of the normal flag signal NFG. The word line WL is raised in response to the output of the normal operation active signal NACT. Further, a signal RG rises to select a column select signal YS, so that data Dout (00) is read.

When only a column address (page address) changes at a time t1, only a column address transition detect signal ATDCOUT is outputted. Since the signal RG has already risen, the column address transition detect signal ATDCOUT is inputted to the column pass timing generator TIMGENC, whereby the column circuit is operated again. A column select signal YS corresponding to a column address (page address) AC1 is selected so that data Dout (01) is read. When only the column address (page address) changes at a time t2, a column select signal YS corresponding to a column address signal AC2 is selected in a manner similar to the above operation, so that data Dout (02) is read.

When a row address AR0 changes at a time t3, a normal flag signal NFG and a normal operation active signal NACT are reset and set again, whereby the word line WL corresponding to the post-change address is raised. Owing to such an operation, a page read mode can be realized while concealing refresh.

Figure 19:
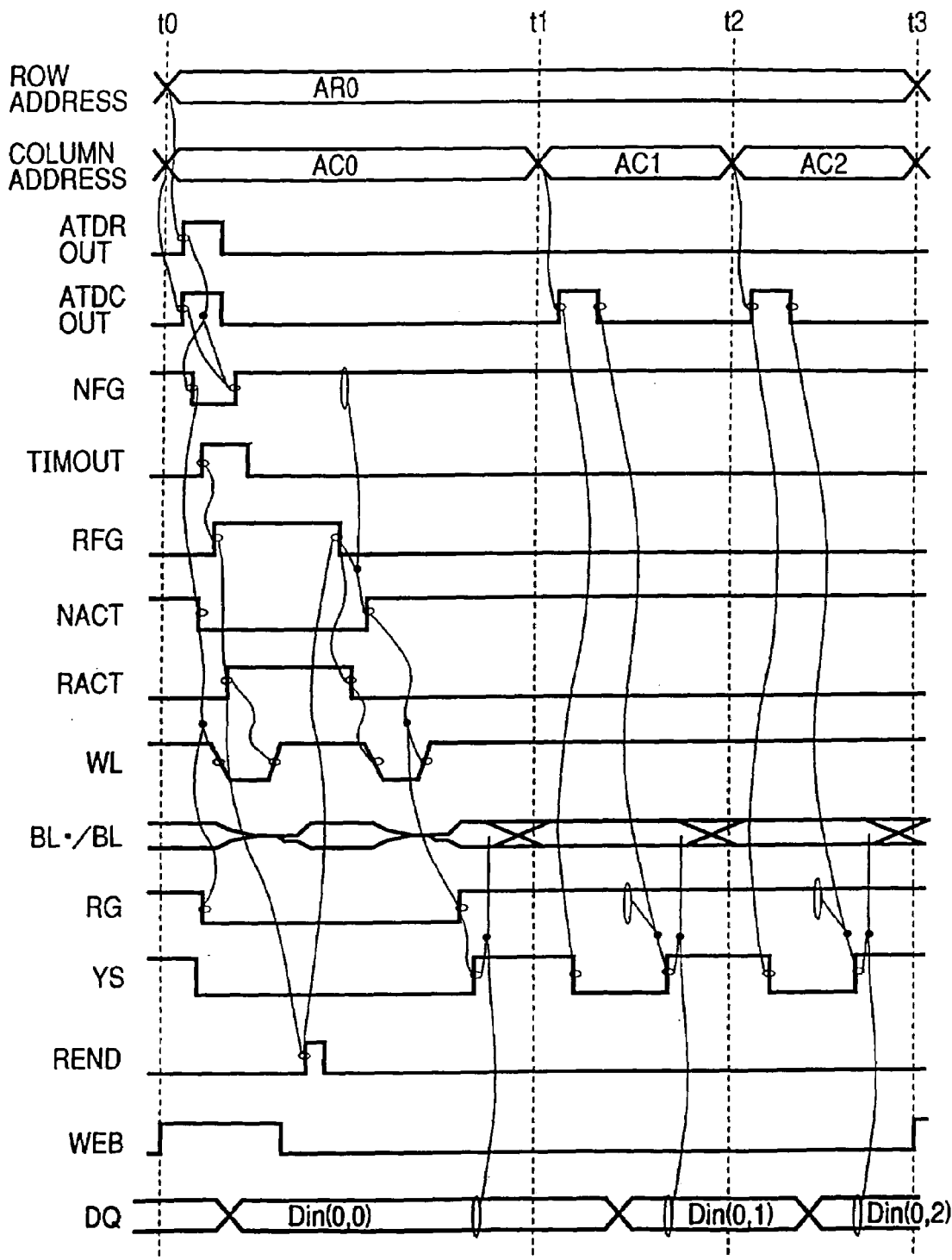
FIG. 19 is a timing chart for describing another example of the operation of the embodiment shown in FIG. 4.

A timing chart for describing another example of the operation of the embodiment shown in FIG. 4 is shown in FIG. 19. The same drawing shows an example of a page write timing chart (1) according to the present invention. When external addresses change to AR0 and AC0 in a manner similar to the above, their corresponding output signals ATDROUT and ATDCOUT of the row address transition detector ATDR and the column address transition detector ATDC are outputted in response to their changes.

The row address transition detect signal ATDROUT is inputted to the normal operation flag generator NGEN of the row pass timing generator TIMGENR, where a normal flag signal NFG and a normal operation active signal NACT are reset. Thereafter, the normal flag signal NFG is set again.

When an output signal TIMOUT of the refresh timer REFTIM is outputted, such an output signal TIMOUT is inputted to the refresh operation flag generator RGEN of the row pass timing generator TIMGENR, where a refresh flag signal RFG is set. Since the refresh flag signal RFG rises earlier than the normal flag signal NFG in the present timing chart, a refresh operation active signal RACT is outputted. In response to the output of the refresh operation active signal RACT, each word line WL in the memory circuit MC is raised so that a refresh operation is executed.

A refresh operation end signal REND is generated from the refresh operation active signal RACT in the same manner as described above, whereby the refresh flag signal RFG, refresh operation active signal RACT and word line WL are reset, so that the corresponding bit lines BL are equalized. When the refresh operation active signal RACT falls, the normal operation active signal NACT rises in response to the output of the normal flag signal NFG. In response to the output of the normal operation active signal NACT, the corresponding word line WL is raised. Further, a signal RG rises and a column select signal YS is selected. Thus, data Din (00) is written into a memory cell selected by the word line WL and the column select signal YS.

When only a column address (page address) changes to AC1 at a time t1, only its corresponding column address transition detect signal ATDCOUT is outputted. Since the signal RG has already risen, the column address transition detect signal ATDCOUT is inputted to the column pass timing generator TIMGENC, where a column circuit is operated again. A column select signal YS corresponding to the column address AC0 is unselected. In the present embodiment, the column select signal YS is prolonged till the start of the next cycle in the case of write in order to ensure a write time.

According to the falling edge of the column address transition detect signal ATDCOUT, a column select signal YS corresponding to the page address AC1 is selected so that data Din (01) is written. When only a column address (page address) changes again at a time t2, the column select signal YS corresponding to the page address AC1 is unselected in a manner similar to the above operation. Thus, a column select signal YS corresponding to the changed page address AC2 is selected, so that data Din (02) is written. Thus, when the input data Din at page write in the timing chart of the present embodiment are changed with the same timings as the addresses, miswriting occur therein. Therefore, it is necessary to change the data between a change in address and a change in address in the next cycle.

When a row address AR0 changes at a time t3, the normal flag signal NFG and the normal operation active signal NACT are reset and thereafter set again. Thus, the corresponding word line WL associated with the post-change address is raised. The rising edge of a write enable signal WEB at a time t3 indicates the completion of a page write cycle. In the present embodiment, a page write mode can be realized while concealing refresh as described above.

Figure 20:
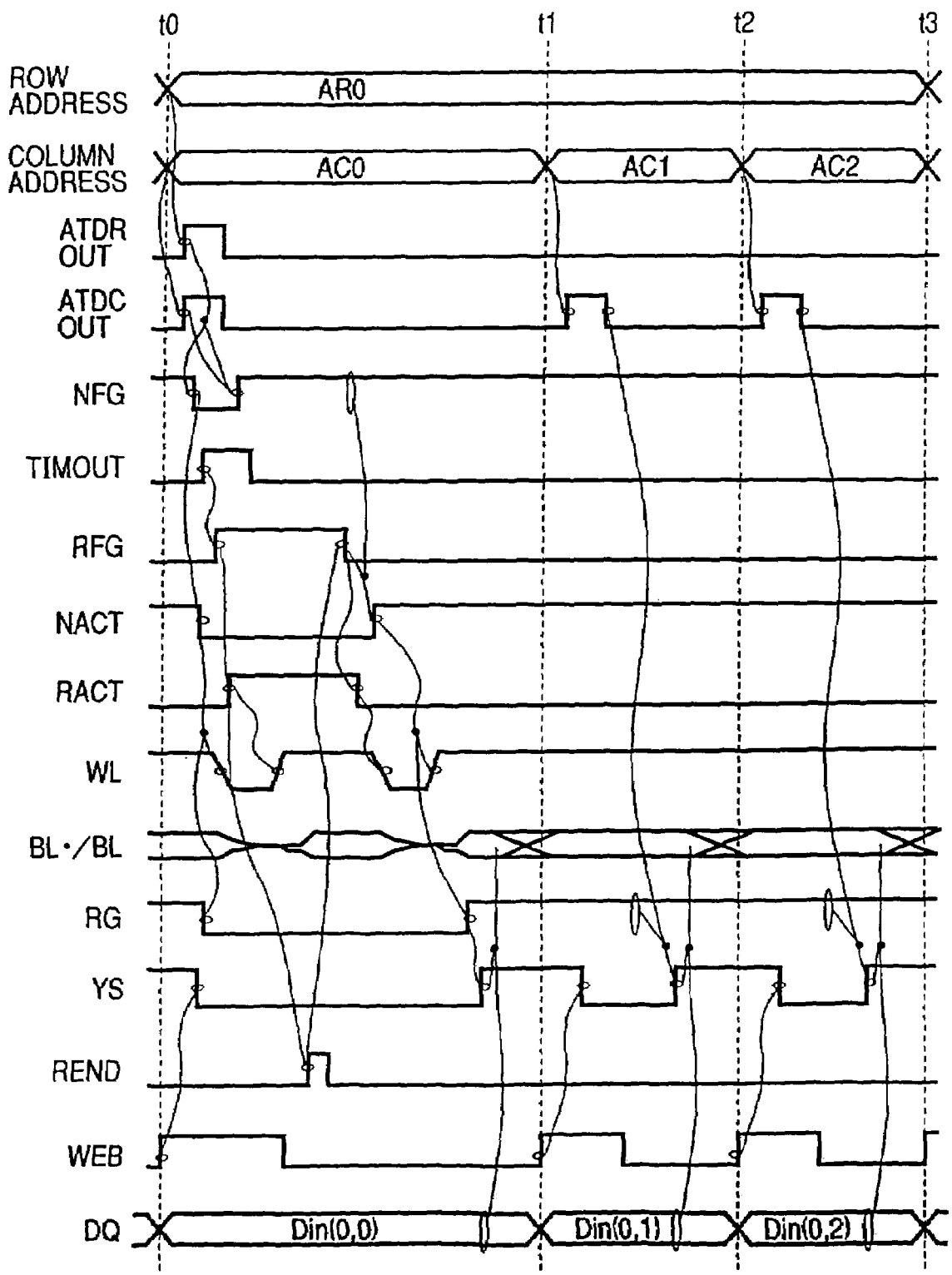
FIG. 20 is a timing chart for describing a further example of the operation of the embodiment shown in FIG. 4.

A timing chart for describing a further example of the operation of the embodiment shown in FIG. 4 is shown in FIG. 20. The same drawing shows an example of a page write timing chart (2) according to the present invention. When external addresses change at a time t0 in the same manner as described above, their corresponding output signals ATDROUT and ATDCOUT of the row address transition detector ATDR and the column address transition detector ATDC are outputted in response to their changes. The row address transition detect signal ATDROUT is inputted to the normal operation flag generator NGEN of the row pass timing generator TIMGENR, where a normal flag signal NFG and a normal operation active signal NACT are reset. Thereafter, the normal flag signal NFG is set again.

When an output signal TIMOUT is outputted from the refresh timer REFTIM, such an output signal TIMOUT is inputted to the refresh operation flag generator RGEN of the row pass timing generator TIMGENR, where a refresh flag signal RFG is set. Since the refresh flag signal RFG rises earlier than the normal flag signal NFG in the present timing chart, a refresh operation active signal RACT is outputted. In response to the output of the refresh operation active signal RACT, each word line WL in the memory circuit MC is raised so that a refresh operation is executed.

A refresh operation end signal REND is generated from the refresh operation active signal RACT in the same manner as described above, whereby the refresh flag signal RFG, refresh operation active signal RACT and word line WL are reset, so that the corresponding bit lines BL are equalized. When the refresh operation active signal RACT falls, the normal operation active signal NACT rises in response to the output of the normal flag signal NFG. In response to the output of the normal operation active signal NACT, the corresponding word line WL in the memory circuit is raised. Further, a signal RG rises and a column select signal YS is selected. Thus, data Din (00) is written. When only a column address (page address) changes at a time t1, only its corresponding column address transition detect signal ATDCOUT is outputted. Since the signal RG has already risen, the column address transition detect signal ATDCOUT is inputted to the column pass timing generator TIMGENC, where a column circuit is operated again.

In the present embodiment, a write enable signal WEB is raised together with the change in the column address (page address) at the time t1. In response to the rising edge of the signal WEB, input data Din (00) is latched inside. A column select signal YS corresponding to the column address AC0 is rendered unselected. This is done to ensure the write time in the same manner as described above. A column select signal YS corresponding to a page address AC1 is selected according to the falling edge of the column address transition detect signal ATDCOUT. After the change in the column address (page address), the write enable signal WEB is caused to fall again to execute a write mode, whereby captured data Din (01) is written.

When only the column address (page address) changes at a time t2 and the write enable signal WEB rises, the column select signal YS associated with the page address AC1 is unselected in a manner similar to the above operation, and hence a column select signal YS corresponding to a page address AC2 is selected. After the change in the column address (page address), the write enable signal WEB is caused to fall again to execute the write mode, whereby data Din (02) is written. Since the input data Din at the page write in the timing chart according to the present embodiment are latched inside upon the rising edge of the write enable signal WEB, no miswriting occurs therein even if they are changed with the same timings as the addresses.

When the row address AR0 changes at a time t3, the normal flag signal NFG and the normal operation active signal NACT are reset and thereafter set again, whereby the corresponding word line WL in the memory circuit MC, which is associated with the post-change address, is raised. The write enable signal WEB is raised even at the time t3. If the write enable signal WEB is not allowed to fall between the times t1 and t2 in the timing chart according to the present embodiment, then memory cell data corresponding to the row address AR0 and column address AC1 can be read out. Namely, page read and page write can be carried out continuously. It is thus possible to implement the page write mode while concealing refresh.

Figure 21:
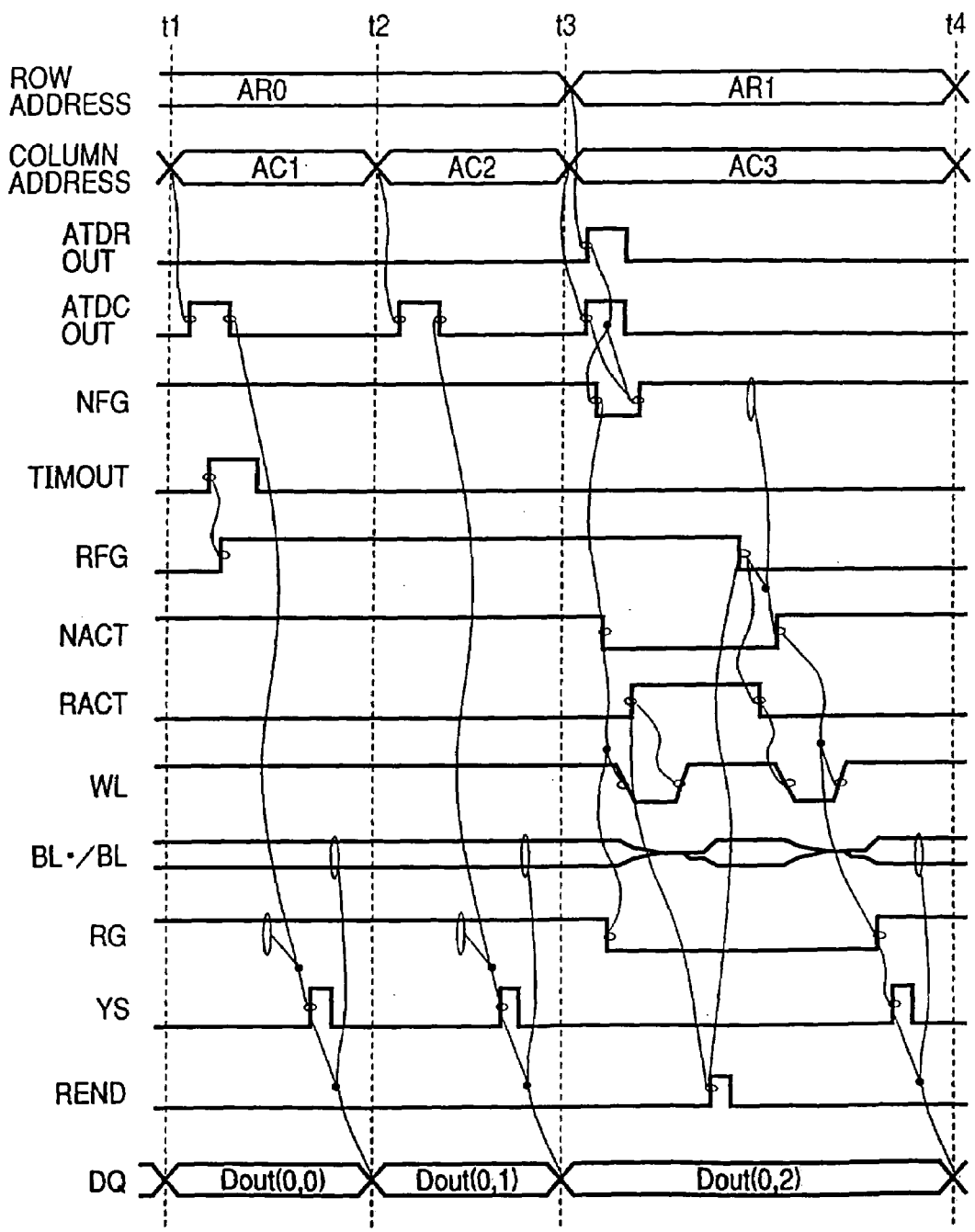
FIG. 21 is a timing chart for describing a still further example of the operation of the embodiment shown in FIG. 4.

A timing chart for describing a still further example of the operation of the embodiment shown in FIG. 4 is shown in FIG. 21. The same drawing shows an example of a page read timing chart (2) according to the present invention. While the refresh flag signal RFG is antecedent to the normal flag signal NFG in the operation shown in FIG. 18, the timing chart according to the present embodiment shows a case in which a normal flag signal NFG is raised earlier than a refresh flag signal RFG in reverse. It is assumed that the refresh flag signal RFG is raised during page read in particular.

Since the normal flag signal NFG and a normal operation active signal NACT continues to rise until the completion of a page read cycle, no refresh operation active signal RACT rises even if the refresh flag signal RFG rises in mid course. When a row address AR0 changes at a time t3, the normal flag signal NFG and the normal operation active signal NACT are reset. Thereafter, the normal flag signal NFG is set again. Since, however, the refresh flag signal RFG has been raised, no normal operation active signal NACT is outputted and the refresh operation active signal RACT is outputted, so that a refresh operation is started.

After the start of the refresh operation according to the refresh operation active signal RACT, a refresh operation end signal REND is outputted. When refresh is fully carried out, the refresh flag signal RFG and the refresh operation active signal RACT are reset. Thereafter, the normal operation active signal NACT rises in response to the reset of the refresh flag signal RFG and the rising edge of the normal flag signal NFG and hence a read operation is carried out in a manner similar to the above. Thus, a page read mode can be implemented while concealing the refresh. Since such an operation is similar even with respect to a page write cycle, its timing chart and the description thereof are omitted.

The present embodiment shows architecture for realizing a page mode in a complete pseudo SRAM. The page mode in the complete pseudo SRAM can be realized owing to two-system division (row address transition detector ATDR and column address transition detector ATDC) of a time multiplex system for realizing refresh concealment and an address transition detector ATD for realizing the page mode.

Since no external refresh request is necessary owing to the provision of the refresh concealing means as described above, the present embodiment can be configured so as to have compatibility with an SRAM interface. Further, high-speed access is allowed owing to the page mode. While a normal cycle of a dynamic RAM formed in a 0.18-µm process is about 70 ns, for example, 25 ns can be implemented in the page mode. Namely, while time is taken for access because it is necessary to activate a word line WL in the normal cycle, the column select signal YS is switched from a state in which the word line has already been activated, to thereby perform accessing, whereby the above speeding-up is enabled in the page mode.

Since the pseudo static RAM according to the present embodiment has the SRAM compatible interface, it can be utilized as an SRAM alternative memory. The rate of transfer of data to the chip's outside can be enhanced owing to the implementation of the page mode.

Figure 22:
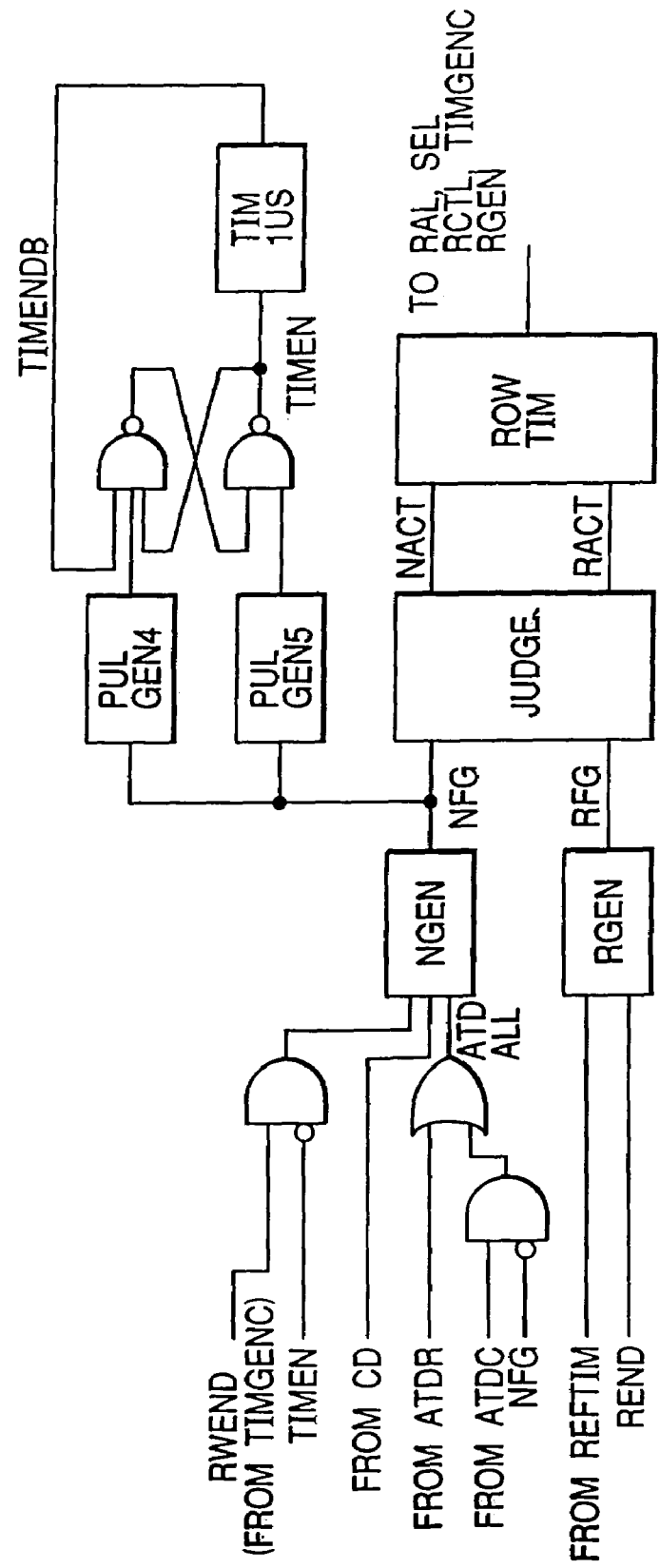
FIG. 22 is a block diagram illustrating another embodiment of the row pass timing generator TIMGENR in FIG. 4.

A block diagram showing another embodiment of the row pass timing generator TIMGENR in FIG. 4 is illustrated in FIG. 22. Namely, the present drawing shows a modification 1 of the embodiment shown in FIG. 5. While the refresh can be carried out before and after the page cycle in the row pass timing generator TIMGENR shown in FIG. 5 as is understood from the timing charts shown in FIGS. 18 through 21, the refresh cannot be performed during the page cycle.

Therefore, there may be a case in which the refresh cannot be carried out if the page cycle is kept long.

As one means for avoiding such a problem that the refresh cannot be carried out during the above page cycle, there is considered a method of providing such specs that a row address or a column address other than a page address is always changed every predetermined intervals. As another means, there is considered such a method that when a given constant period has elapsed, a normal access time is required upon its subsequent first access even if only a page address is changed.

The row pass timing generator TIMGENR according to the present embodiment is used to realize the latter method. A timer TIM1US is started up from a normal flag signal NFG. To this end, a one-shot pulse generator PULGEN5 generates a one-shot pulse from the rising edge of the normal flag signal NFG to thereby set a signal TIMEN for a latch.

If it is assumed that the timer TIM1US is of a 1-μs timer, a timer signal TIMENDB is outputted when 1 μs has elapsed after the setting of the signal TIMEN, and the signal TIMEN is reset. When an operation end signal RWEND is outputted after the resetting of the signal TIMEN, it is inputted to a normal operation flag generator NGEN, where the normal flag signal NFG is reset. When the normal flag signal NFG is reset, a normal operation active signal NACT and a word line WL are reset so that a page mode is released.

Since the normal flag signal NFG is set again after its resetting, the normal operation active signal NACT rises after the execution of a refresh operation if a refresh flag signal RFG has already been raised. Thus, the word line WL corresponding to an address in the corresponding cycle is raised so that a normal operation is executed. When the normal flag signal NFG falls ahead of 1 μs, a one-shot pulse generator PULGEN4 generates a one-shot pulse to reset the signal TIMEN so as to avoid the output of the timer output signal TIMENDB.

The signal RWEND is a signal generated with timing provided to terminate read and write operations from the falling edges of a column address transition detect signal ATDCOUT and a row address transition detect signal ATDROUT. The difference in timing between a page cycle and a normal cycle makes a distinction between the page cycle if a signal RG at the falling edge of the column address transition signal ATDCOUT=high level and the normal cycle if the signal RG=low level.

Figure 23:
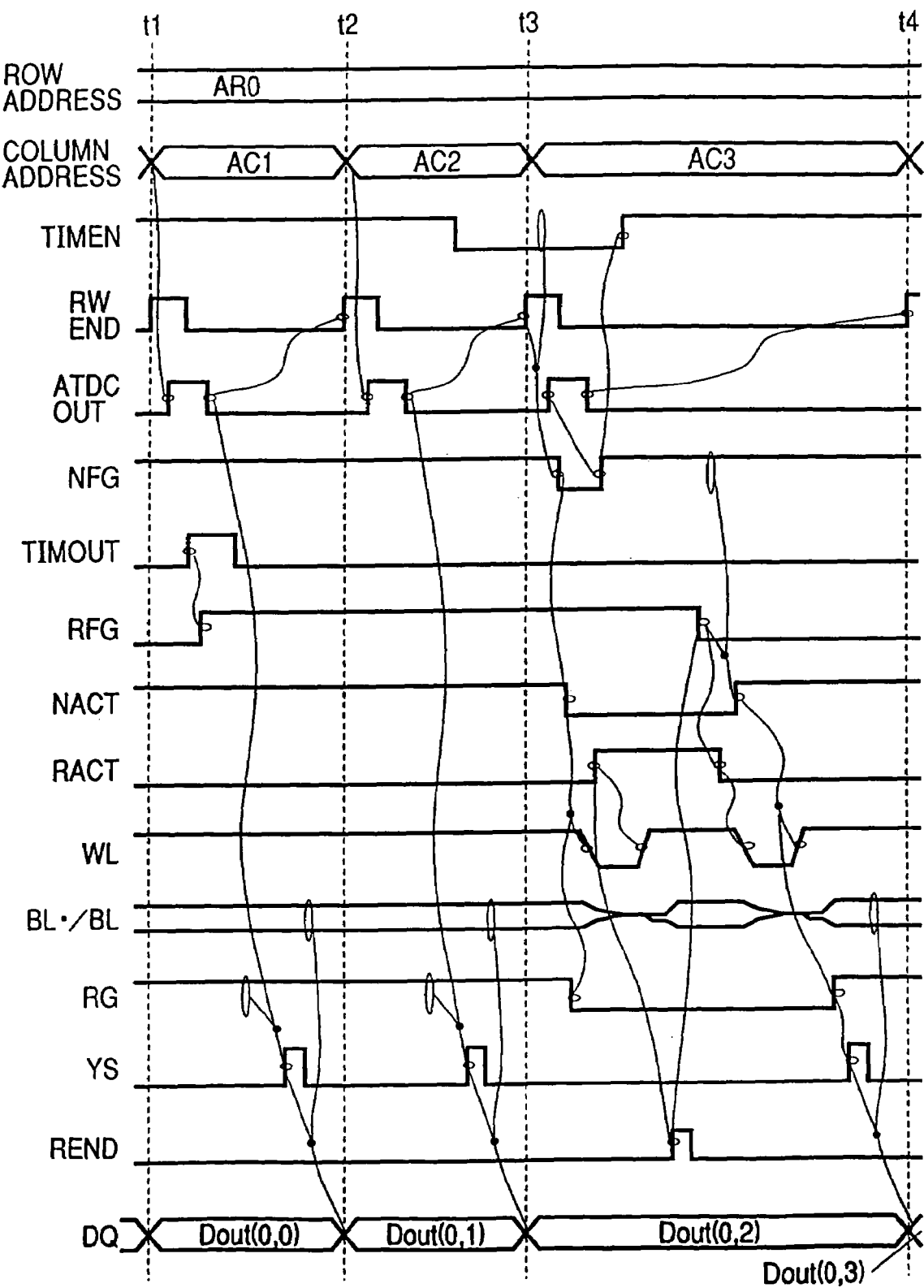
FIG. 23 is a timing chart for describing a page read operation using the row pass timing generator TIMGENR shown in FIG. 22.

A timing chart for describing a page read operation using the row pass timing generator TIMGENR shown in FIG. 22 is shown in FIG. 23. The same drawing shows a case in which a normal flag signal NFG rises earlier than a refresh flag signal RFG. It is assumed that the refresh flag signal RFG is raised during page read in particular.

Since 1 μs has elapsed since the beginning of a page mode, a timer output TIMENDB is outputted and hence a signal TIMEN is disabled. When a signal RWEND is outputted after the signal TIMEN is disabled, the normal flag signal NFG is reset so that a normal operation active signal NACT and a word line WL are brought down to release the page mode. The normal flag signal NFG is set again based on a column address transition detect signal ATDCOUT.

Since the refresh flag signal RFG has been raised when the normal flag signal NFG is reset, a refresh operation active signal RACT rises to execute a refresh operation. Thereafter, the refresh flag signal RFG and the refresh operation active signal RACT fall in response to a refresh operation end signal REND, whereby the refresh operation is terminated. Since the normal flag signal NFG has already risen with it completion, the normal operation active signal NACT and the word line WL are raised so that a read operation that needs a normal access time, is executed. Even when a page read cycle continues long, the normal flag signal NFG falls after the elapse of a given constant interval, thereby enabling an interrupt for the refresh operation. However, the normal access time is required for each given constant time interval.

Figure 24:
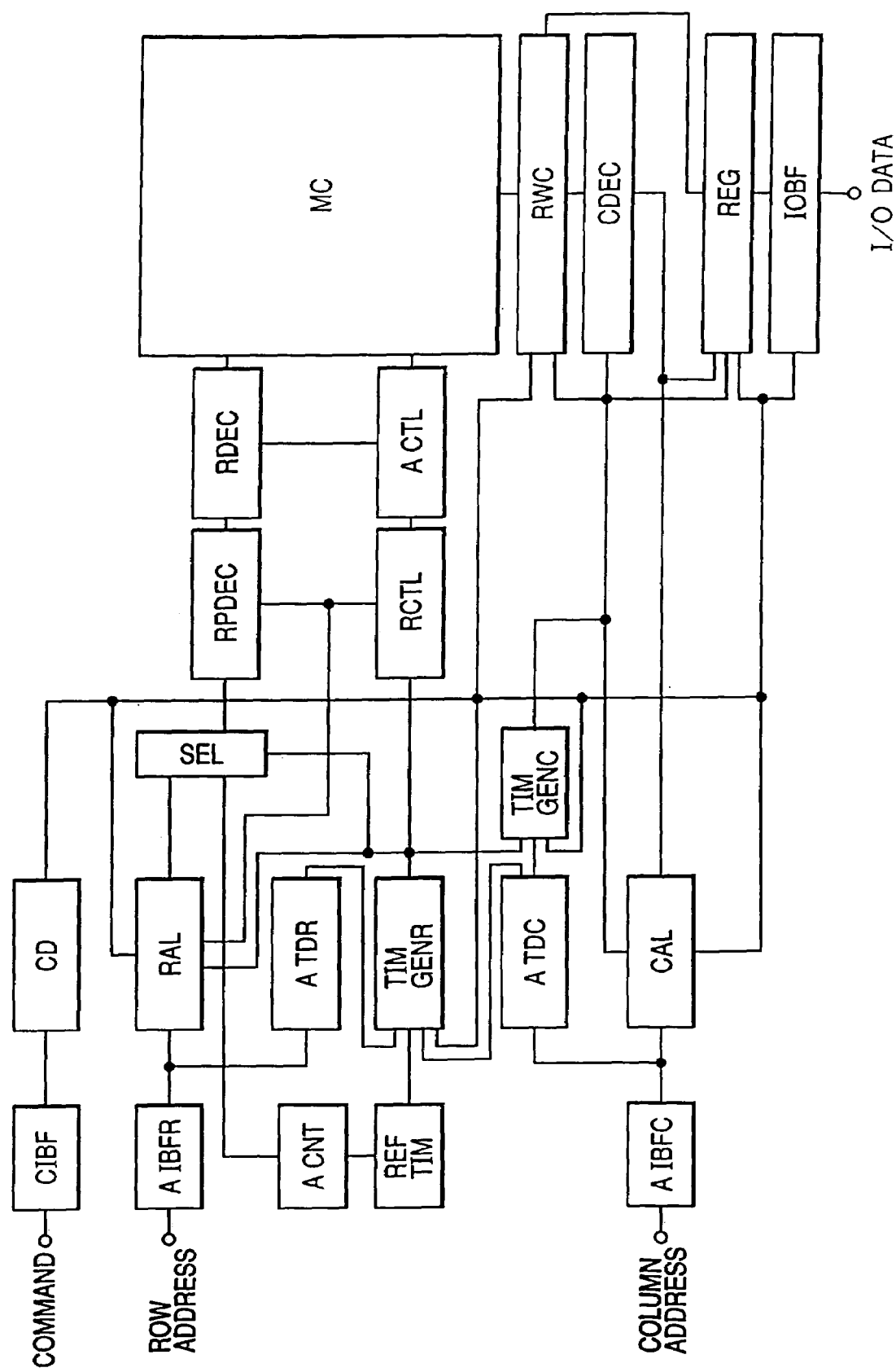
FIG. 24 is a block diagram showing another embodiment of a semiconductor memory device according to the present invention.

A block diagram showing another embodiment of a semiconductor memory device according to the present invention is shown in FIG. 24. The present embodiment is a first modification of FIG. 4 and provided with a register REG in front of an input/output buffer IOBF with respect to the embodiment of FIG. 4. The register REG is set to the number of bits corresponding to (page size)×(I/O bus width). A prefetch operation is enabled owing to the addition of such a register REG. Namely, the prefetch operation is a system for reading data corresponding to the page size at a time in one access and storing the same in the register REG.

Figure 25:
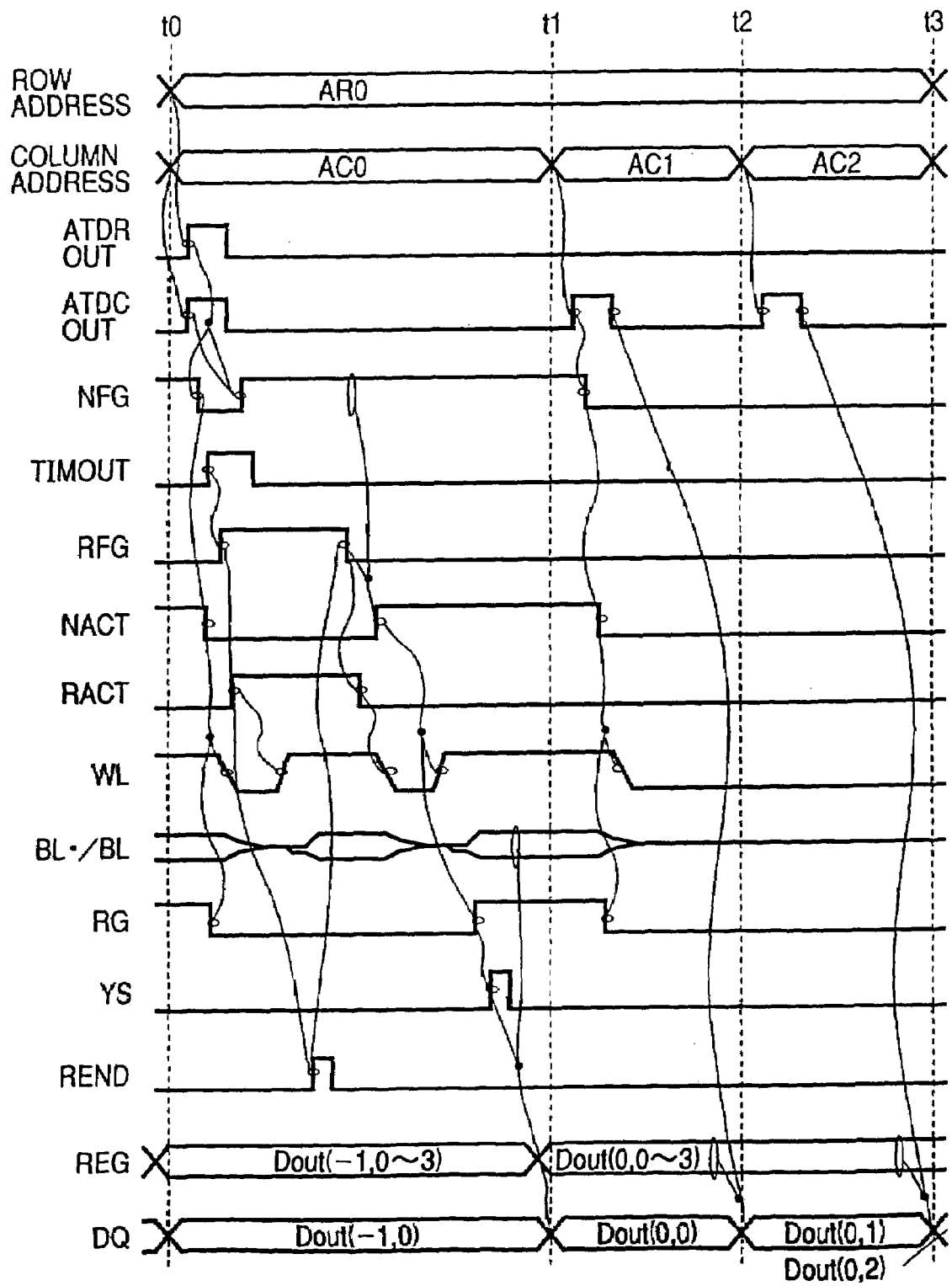
FIG. 25 is a timing chart for describing one example illustrative of operations of respective circuits employed in the embodiment shown in FIG. 24.

A timing chart for describing one example illustrative of operations of respective circuits employed in the embodiment of FIG. 24 is shown in FIG. 25. The same drawing shows a page read timing chart according to the present invention. When external addresses change at a time t0 in a manner similar to the above, their corresponding detect signals ATDROUT and ATDCOUT of a row address transition detector ATDR and a column address transition detector ATDC are outputted in response to their changes.

The row address transition detect signal ATDROUT is inputted to its corresponding normal operation flag generator NGEN of a row pass timing generator TIMGENR, where a normal flag signal NFG and a normal operation active signal NACT are reset. Thereafter, the normal flag signal NFG is set again.

When an output signal TIMOUT is outputted from a refresh timer REFTIM, such an output signal TIMOUT is inputted to its corresponding refresh operation flag generator RGEN of the row pass timing generator TIMGENR, where a refresh flag signal RFG is set. Since the refresh flag signal RFG rises earlier than the normal flag signal NFG in the present timing chart, a refresh operation active signal RACT is outputted.

In response to the output of the refresh operation active signal RACT, the corresponding word line WL in a memory circuit MC is raised so that a refresh operation is executed. A refresh operation end signal REND is generated from the refresh operation active signal RACT in the same manner as described above, whereby the refresh flag signal RFG, the refresh operation active signal RACT, and the corresponding word line WL in the memory circuit MC are reset in response to the output of the refresh operation end signal REND, so that the corresponding bit lines BL are equalized.

When the refresh operation active signal RACT falls, the normal operation active signal NACT rises in response to the output of the normal flag signal NFG. In response to the output of the normal operation active signal NACT, the corresponding word line WL in the memory circuit MC is raised. Further, a signal RG rises and hence a column select signal YS is selected. Thus, data Dout (00) through Dout (03) are read and latched in the register REG. Further, the data Dout (00) is outputted to the outside. At this time, the page size is represented as 4 words.

When only a column address (page address) changes at a time t1, only the column address transition detect signal ATDCOUT is outputted. The normal flag signal NFG is reset since the rising edge of the column address transition detect signal ATDCOUT. Access to the register REG, corresponding to a column address AC1 is made from the falling edge of the column address transition detect signal ATDCOUT, whereby Dout (01) is outputted to the outside.

When only the column address (page address) changes at a time t2 again, access to the register REG, corresponding to a column address AC2 is produced in a manner similar to the above operation, whereby the data Dout (02) is outputted to the outside. When a row address AR0 changes at a time t3, the normal flag signal NFG and the normal operation active signal NACT are set so that the corresponding word line WL in the memory circuit MC, which is associated with the post-change address, is raised. A page read mode can be realized in this way while concealing refresh. Since the word line WL in the memory circuit MC is not raised during a page read period in the present embodiment, the refresh is enabled. It is therefore possible to avoid such a circumstance developed in the embodiment of FIG. 4 that the refresh cannot be carried out when the page cycle continues to function long.

The present embodiment needs an 8×16=128-bit register REG in the case of an 8-word page, ×16-bit I/O product. Further, the number of data lines from a main amplifier to an output register REG results in 8 times for the purpose of 8-word simultaneous reading. When it is desired to execute page write, it can be carried out with operation similar to each of FIGS. 19 and 20 implemented by the embodiment of FIG. 4. Alternatively, write data is stored in a register REG, a write back period is provided, and the data may be written into a memory cell at a time. As another alternative, one may be used which is provided with a write-dedicated register REG and in which a Late Write system is adopted, i.e., write data in the corresponding write cycle is stored in the register REG and written into a memory cell in the next write cycle.

Figure 26:
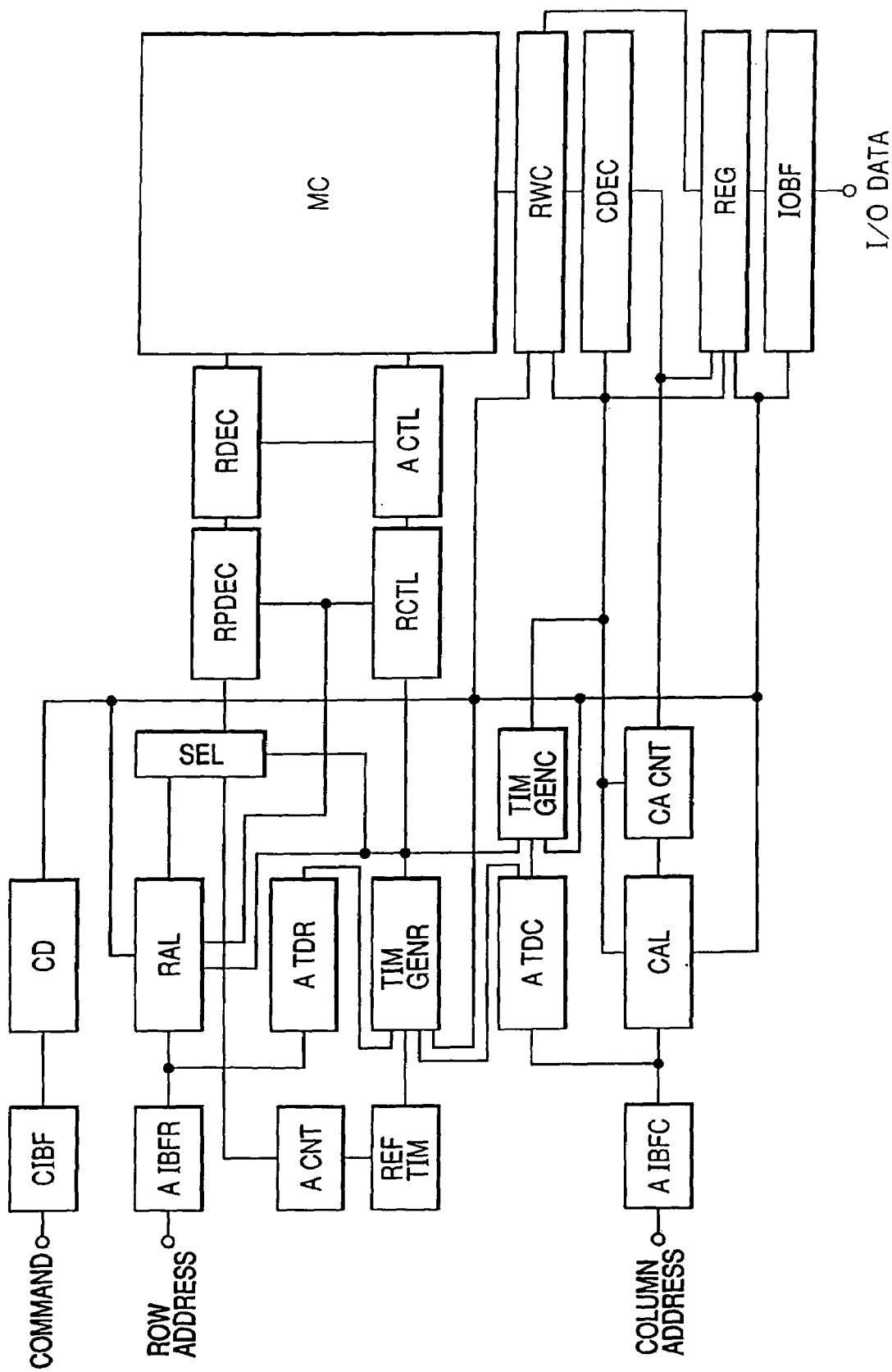
FIG. 26 is a block diagram showing a further embodiment of a semiconductor memory device according to the present invention.

A block diagram showing a further embodiment of a semiconductor memory device according to the present invention is illustrated in FIG. 26. The present embodiment is a second modification of FIG. 4 and is provided with a register REG in front of the input/output buffer IOBF and a column address counter CACNT behind the column address latch CAL with respect to the embodiment of FIG. 4. Even in the present embodiment, the number of bits for the register REG is equivalent to (page size)×(I/O bus width). The column address counter CACNT counts addresses corresponding to a page size. In the present embodiment, the column address counter CACNT is used to access a column select signal YS by the page size in one access, whereby read data is stored in the register REG.

Figure 27:
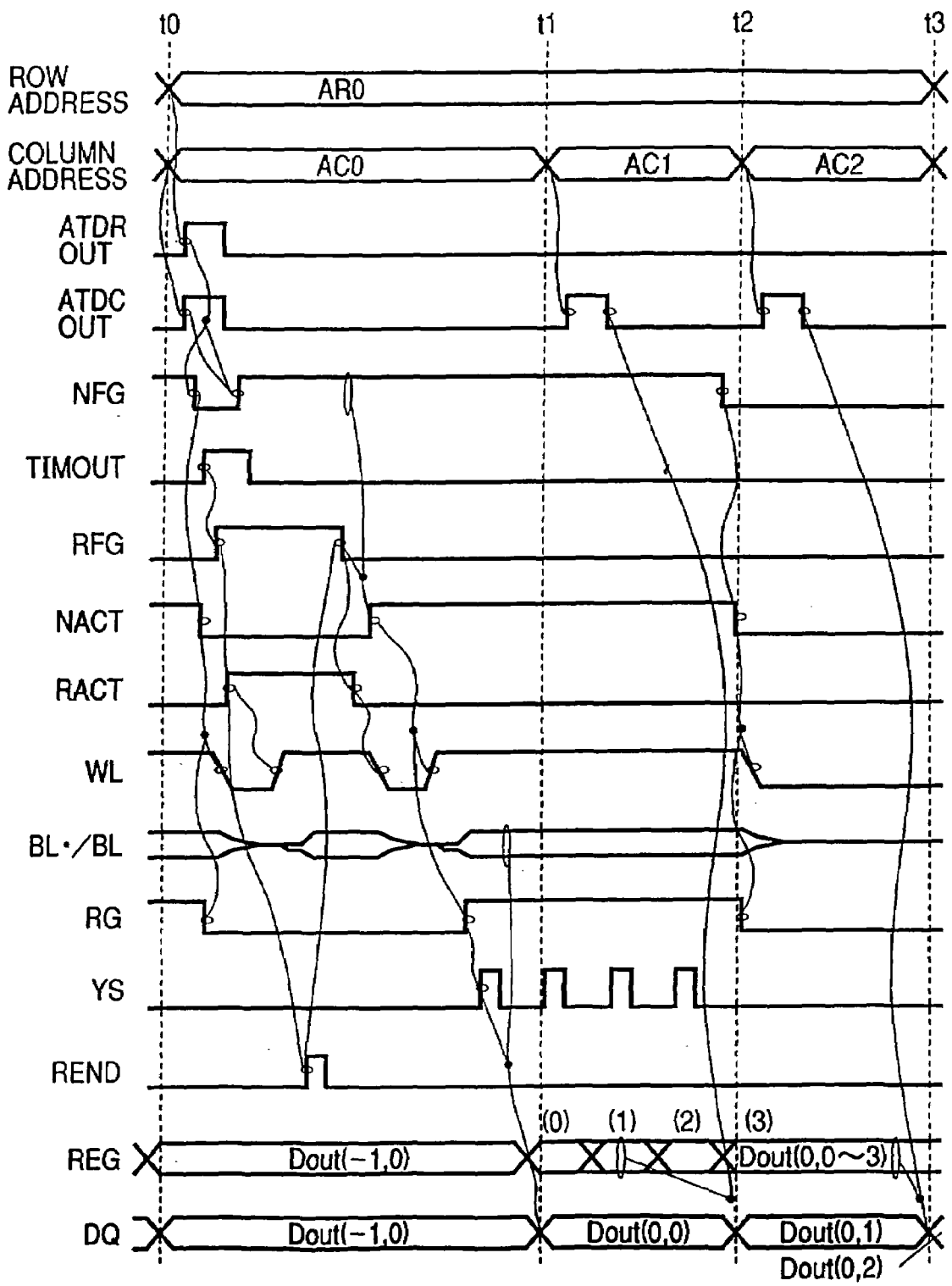
FIG. 27 is a timing chart for describing one example illustrative of operations of respective circuits employed in the embodiment shown in FIG. 26.

A timing chart for describing one example illustrative of operations of respective circuits employed in the embodiment of FIG. 26 is shown in FIG. 27. The same drawing shows a page read timing chart according to the present invention. When external addresses change at a time t0 in a manner similar to the above, their corresponding detect signals ATDROUT and ATDCOUT of a row address transition detector ATDR and a column address transition detector ATDC are outputted in response to their changes. The row address transition detect signal ATDROUT is inputted to its corresponding normal operation flag generator NGEN of a row pass timing generator TIMGENR, where a normal flag signal NFG and a normal operation active signal NACT are reset. Thereafter, the normal flag signal NFG is set again.

When an output signal TIMOUT is outputted from a refresh timer REFTIM, such an output signal TIMOUT is inputted to its corresponding refresh operation flag generator RGEN of the row pass timing generator TIMGENR, where a refresh flag signal RFG is set. Since the refresh flag signal RFG rises earlier than the normal flag signal NFG in the present timing chart, a refresh operation active signal RACT is outputted.

In response to the output of the refresh operation active signal RACT, the corresponding word line WL in a memory circuit MC is raised so that a refresh operation is executed. A refresh operation end signal REND is generated from the refresh operation active signal RACT in the same manner as described above, whereby the refresh flag signal RFG, the refresh operation active signal RACT, and the corresponding word line WL are reset in response to such a generated output, so that the corresponding bit lines BL are equalized.

When the refresh operation active signal RACT falls, the normal operation active signal NACT rises in response to the output of the normal flag signal NFG. In response to the output of the normal operation active signal NACT, the corresponding word line WL in the memory circuit MC is raised. Further, a signal RG rises and hence a column select signal YS is selected. Consequently, data Dout (00) is read. Further, the data is latched in the register REG. Afterwards, the column address counter CACNT counts up each of the column addresses by a page size. Thus, column select signals YS corresponding thereto are selected one after another, so that up to data Dout (01) through Dout (03) are read out, followed by being latched in the register REG. At this time, the page size is represented as 4 words.

After the reading of the data, the normal flag signal NFG is reset so that the normal operation active signal NACT and the corresponding word line WL are dropped. When only a column address (page address) changes at a time t1, only the column address transition detect signal ATDCOUT is outputted. Access to the register REG, corresponding to a column address AC1 is made from the falling edge of the column address transition detect signal ATDCOUT, whereby the data Dout (01) is outputted to the outside. When only the column address (page address) changes at a time t2 again, access to the register REG, corresponding to a column address AC2 is made in a manner similar to the above operation, whereby the data Dout (02) is outputted to the outside.

When a row address AR0 changes at a time t3, the normal flag signal NFG and the normal operation active signal NACT are set so that the corresponding word line WL associated with the post-change address is raised. Thus, a page read mode could be realized while concealing refresh. Since the word line WL in the memory circuit MC is not raised during a page read period, the refresh is enabled. It is therefore possible to avoid such a circumstance developed in the embodiment of FIG. 4 that the refresh cannot be carried out when the page cycle continues to function long. In the case of an 8-word page, ×16-bit I/O product, an 8×16=128-bit register REG is needed. Since data corresponding to a page size must be stored in the register REG up to the time t2, a page cycle (t1 to t2) or first access (t0 to t1) becomes late.

When it is desired to execute page write, the page write operation shown in FIGS. 19 and 20 corresponding to the embodiment of FIG. 4 can be carried out similarly. Alternatively, write data is stored in a register REG, a write back period is provided, and the data is written into each memory cell at a time or sequentially through the use of a counter. As another alternative, a write-dedicated register REG is provided, and a Late Write system may be used, i.e., write data in the corresponding cycle may be stored in the register REG and written into a memory cell in the next write cycle.

Figure 28:
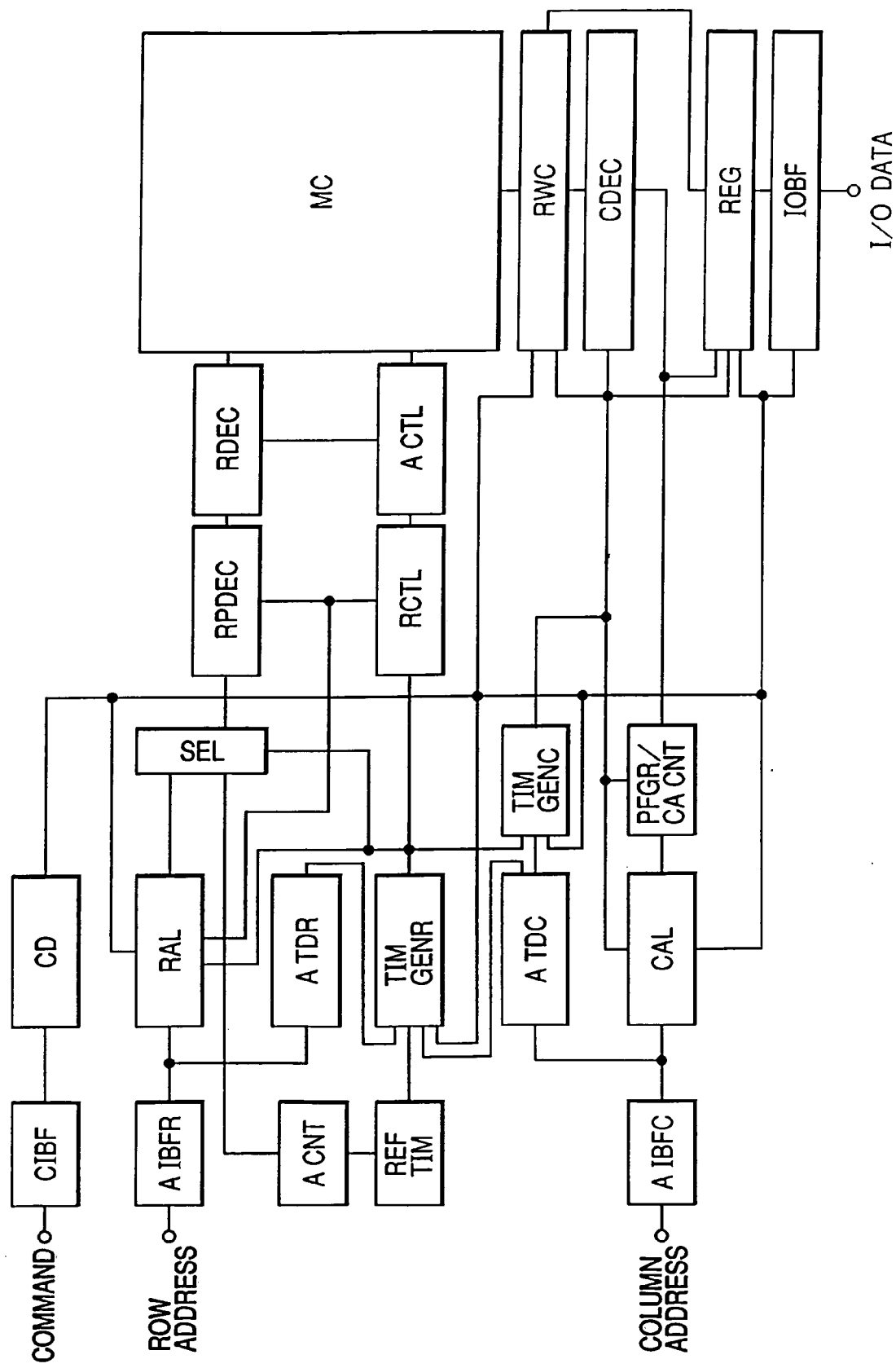
FIG. 28 is a block diagram illustrating a still further embodiment of a semiconductor memory device according to the present invention.

A block diagram showing a still further embodiment of a semiconductor memory device according to the present invention is shown in FIG. 28. The present embodiment is a third modification of FIG. 4 and provided with a register REG in front of an input/output buffer IOBF, and a page flag register PFGR and a column address counter CACNT behind a column address latch CAL. The number of bits for the register REG is equivalent to (page size)×(I/O bus width). The number of bits for the page flag register PFGR corresponds to a page size. The column address counter CACNT counts addresses corresponding to the page size.

Upon first access in a page mode, the normal memory access is carried out. A flag indicating that data at each external page address at that time has been read, is set simultaneously with the execution of the above access. The flag is stored in the page flag register PFGR. Flags corresponding to other than the page address are all reset. Data read at this time are stored in the register REG.

When the external page address is inputted upon the subsequent page access, the flag in the page flag register PFGR, corresponding to the address is checked. If it is reset, then the normal memory access is carried out and at the same time the flag corresponding to the external page address at this time is set. Data read out at this time is stored in the register REG. When the flag is set, access is made to the register REG to read the data in the register REG. Simultaneously, the column address counter CACNT counts up each page address corresponding to an external input. A flag for the counted-up address is checked again. The column address counter CACNT continues to count up to reach the reset flag.

When the reset flag is reached, the normal memory access is effected on each address corresponding to the reset flag. Simultaneously, the flag corresponding to the page address is set to the page flag register PFGR, and read data is stored in the register REG. When the flags associated with all the page addresses are set, no operation is done.

Figure 29:
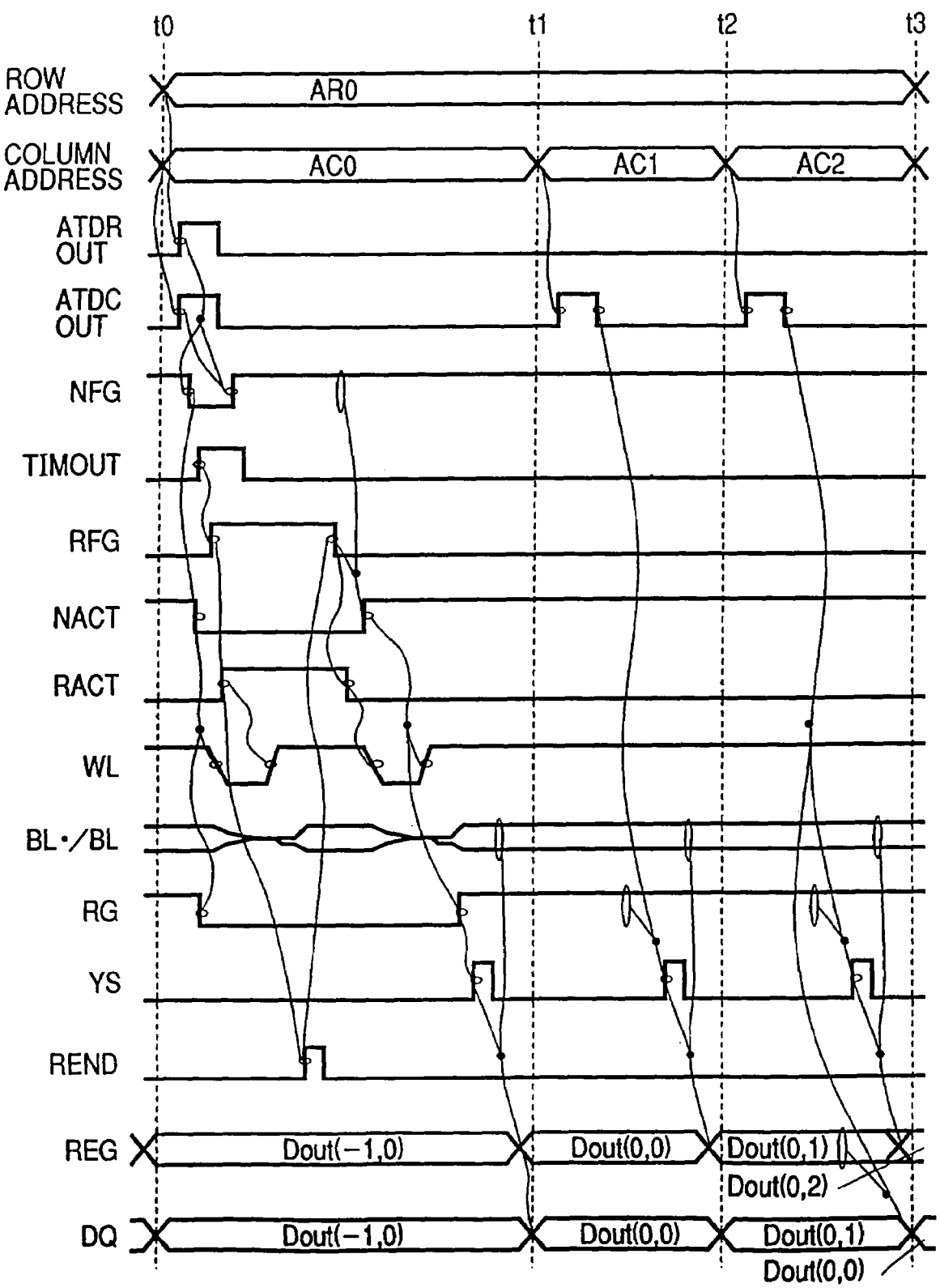
FIG. 29 is a timing chart for describing one example illustrative of operations of respective circuits employed in the embodiment shown in FIG. 28.

A timing chart for describing one example illustrative of operations of respective circuits employed in the embodiment of FIG. 28 is shown in FIG. 29. The same drawing shows an example of a page read timing chart. The same drawing shows a page read timing chart according to the present invention. When external addresses change at a time t0, their corresponding output signals ATDROUT and ATDCOUT of a row address transition detector ATDR and a column address transition detector ATDC are outputted in response to their changes. The row address transition detect signal ATDROUT is inputted to its corresponding normal operation flag generator NGEN of a row pass timing generator TIMGENR, where a normal flag signal NFG and a normal operation active signal NACT are reset. Thereafter, the normal flag signal NFG is set again.

When an output TIMOUT is outputted from a refresh timer REFTIM, such an output signal TIMOUT is inputted to its corresponding refresh operation flag generator RGEN of the row pass timing generator TIMGENR, where a refresh flag signal RFG is set. Since the refresh flag signal RFG rises earlier than the normal flag signal NFG in the present timing chart, a refresh operation active signal RACT is outputted.

In response to the output of the refresh operation active signal RACT, the corresponding word line WL is raised so that a refresh operation is executed. A refresh operation end signal REND is generated from the refresh operation active signal RACT, whereby the refresh flag signal RFG, the refresh operation active signal RACT, and the corresponding word line WL are reset in response to such a generated output, so that the corresponding bit lines BL are equalized.

When the refresh operation active signal RACT falls, the normal operation active signal NACT rises in response to the output of the normal flag signal NFG. In response to the output of the normal operation active signal NACT, the corresponding word line WL is raised. Further, a signal RG rises and hence a column select signal YS is selected, whereby data Dout (00) is read. Further, the data is latched in the register REG. Simultaneously, a flag corresponding to an external input page address AC0 in the corresponding cycle is set and latched in the page flag register PFGR. In addition, flags corresponding to other page addresses AC1 through AC3 are reset. At this time, a page size is represented as 4 words.

When only a column address (page address) changes to AC1 at a time t1, a flag corresponding to AC1 is checked. Since the flag has been reset, the normal access to each memory cell, corresponding to AC1 is done, so that data Dout (01) is read. Further, the data is latched in the register REG. At the same time the flag corresponding to the address AC1 is set and latched in the page flag register PFGR.

When only the column address (page address) changes to AC0 again at a time t2, a flag corresponding to AC0 is checked. Since the flag has been set, access to the register REG corresponding to AC0 is made to output the data Dout (00) to the outside. Simultaneously, the address AC0 is counted up and a flag corresponding to the counted-up address AC1 is checked. Since the flag has been set, an address is counted up again, and a flag corresponding to the counted-up address AC2 is checked. Since the flag has been reset, the normal access to each memory cell associated with the address AC2 is done, and read data Dout (02) is latched in the register REG. At the same time the flag corresponding to the address AC2 is set and latched in the page flag register PFGR.

When a row address AR0 changes at a time t3, the normal flag signal NFG and the normal operation active signal NACT are set so that the corresponding word line WL associated with the post-change address is raised. Thus, a page mode can be realized while concealing refresh. When the page cycle corresponding to the page size is terminated, the word line WL can be lowered. Namely, even if a page read period continues to function long, the word line WL is lowered subsequently to a page cycle number corresponding to the page size, thereby making it possible to perform the refresh. It is therefore possible to avoid such a circumstance developed in the embodiment of FIG. 4 that the refresh cannot be carried out when the page cycle continues to function long.

In the case of an 8-word page, ×16-bit I/O product, an 8×16=128-bit register REG and 8-bit page flag register PFGR and column address counter CACNT are needed. Further, since no refresh is allowed until the completion of the page cycle corresponding to the page size, the page cycle corresponding to the page size is set so as not to function longer than a refresh cycle or period. Alternatively, such specs that when the page cycle becomes longer than the refresh cycle, a row address or a column address other than a page address is changed for each predetermined period, is adopted, or such a method that when a given constant period has elapsed, the normal access time is required upon its subsequent first access even if only a page address has changed, is adopted, thereby making it possible to avoid such a problem. The latter method can be realized by using the timer TIM1US shown in FIG. 22.

When it is desired to execute page write, it can be carried out according to operations similar to the timing chart shown in each of FIGS. 19 and 20, which is implemented by the block diagram of FIG. 4. Alternatively, write data is stored in a register REG, a write back period is provided, and the data is written into each memory cell at a time or sequentially through the use of a counter. As another alternative, a write-dedicated register REG is provided, and a Late Write system, i.e., such a system that write data in the corresponding cycle is stored in the register REG and written into a memory cell in the next write cycle, may be used to perform such data writing.

Figure 30:
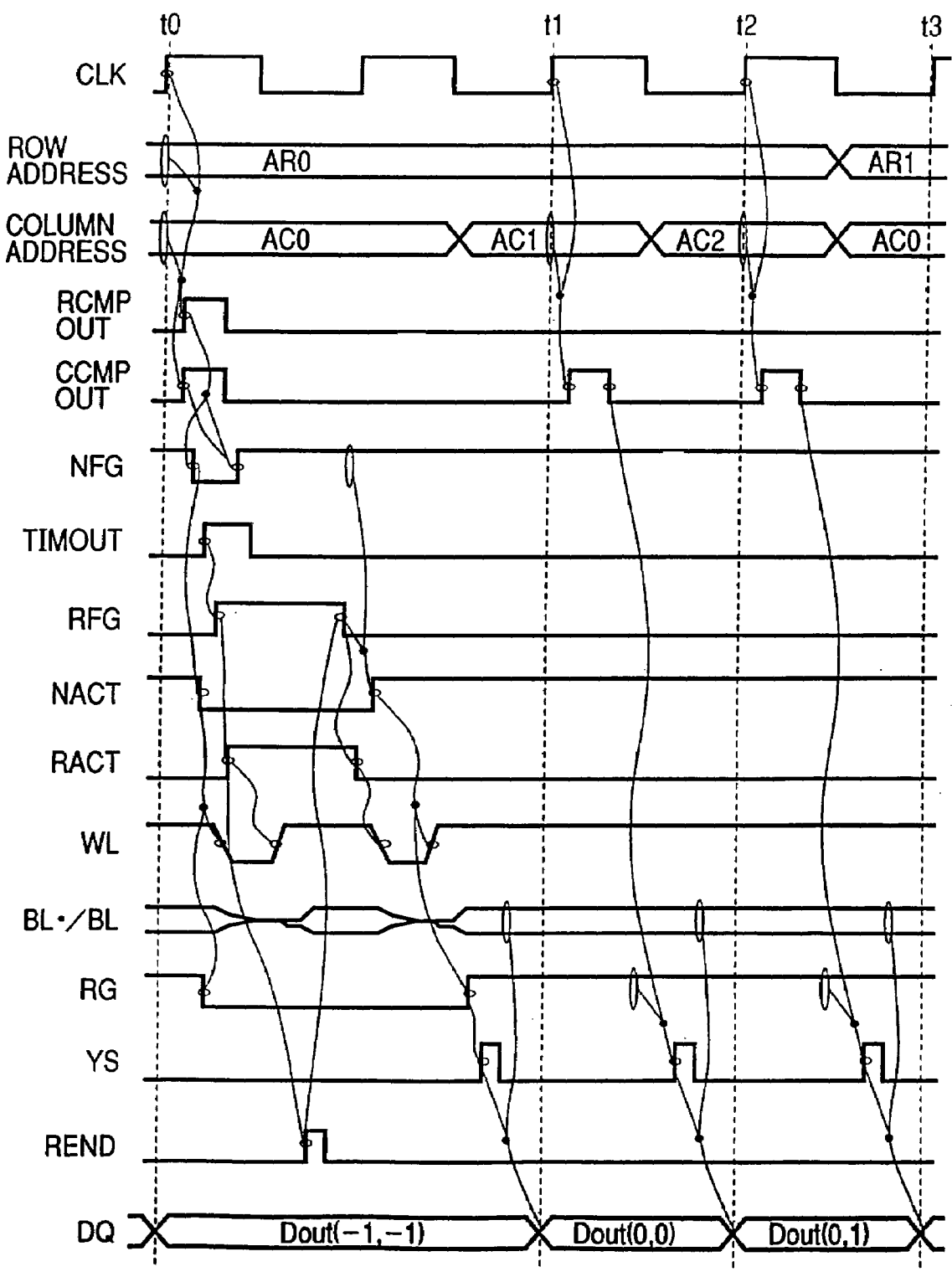
FIG. 30 is a timing chart for describing a still further example of the operation of the embodiment shown in FIG. 4.

A timing chart for describing a still further example of the operation of the embodiment shown in FIG. 4 is shown in FIG. 30. The present embodiment corresponds to a fourth modification of FIG. 4. A clock signal CLK is inputted from outside. Namely, the present embodiment is one of such a type that each address is captured on the rising edge of the clock CLK in the embodiment shown in FIG. 4. The address transition detector ATD may be utilized to start an internal operation. As an alternative, however, such a method that each address captured in a previous cycle is latched inside and compared with each address latched upon address capture in the corresponding cycle, and if both are different from each other, then the internal operation is started, may be utilized.

When each external address is captured inside at a time t0 from the rising edge of the clock, it is compared with the address latched inside. If they are different from each other, then output signals RCMPOUT and CCMPOUT of a row address comparator RCMP and a column address comparator CCMP are outputted in response to its difference. The output signals RCMPOUT and CCMPOUT are respectively associated with the address transition detect signals ATDROUT and ATDCOUT shown in FIG. 18. The output signal RCMPOUT is inputted to its corresponding normal operation flag generator NGEN of the row pass timing generator TIMGENR, where a normal flag signal NFG, and a normal operation active signal NACT are reset. Thereafter, the normal flag signal NFG is set again.

When an output signal TIMOUT is outputted from the refresh timer REFTIM, such an output signal TIMOUT is inputted to its corresponding refresh operation flag generator RGEN of the row pass timing generator TIMGENR, where a refresh flag signal RFG is set. Since the refresh flag signal RFG rises earlier than the normal flag signal NFG in the present timing chart, a refresh operation active signal RACT is outputted. In response to the output of the refresh operation active signal RACT, the corresponding word line WL is raised so that a refresh operation is executed.

A refresh operation end signal REND is generated from the refresh operation active signal RACT. In response to such a generated output, the refresh flag signal RFG, the refresh operation active signal RACT, and the corresponding word line WL are reset, so that the corresponding bit lines BL are equalized. When the refresh operation active signal RACT falls, the normal operation active signal NACT rises in response to the output of the normal flag signal NFG. In response to the output of the normal operation active signal NACT, the corresponding word line WL is raised. Further, a signal RG rises and hence a column select signal YS is selected, whereby data Dout (00) is read.

When only a column address (page address) changes to AC1 before a time t1, the corresponding address is captured inside from the rising edge of the clock at the time t1, and only the column address compare output signal CCMPOUT is outputted. Since the signal RG has been raised, the column address compare output signal CCMPOUT is inputted to its corresponding column pass timing generator TIMGENC, whereby a column circuit is operated again. Thus, a column select signal YS corresponding to the address AC1 is selected and hence data Dout (01) is read.

When only the column address (page address) is changed to AC2 again before a time t2, a column select signal YS associated with the address AC2 is selected after the time t2 in a manner similar to the above operation, so that data Dout (02) is read. When a road address AR0 changes to AR1 before a time t3, the corresponding address is captured inside from the rising edge of the clock at the time t3, so that its corresponding row address compare output signal RCMPOUT is outputted. As a result, the normal flag signal NFG and the normal operation active signal NACT are reset and thereafter set again, whereby the corresponding word line WL associated with the post-change address is raised. Thus, a page read mode can be realized while concealing refresh.

Since page write can be carried out in a manner similar to the page write (see FIGS. 19 and 20) employed in the embodiment of FIG. 4, the description thereof is omitted. As an alternative to the clock signal CLK, a row address strobe signal RAS and a column address strobe signal CAS may be used. Alternatively, an interface may be used which is similar to the conventional synchronous DRAM using CLK and RAS and CAS. When RAS and CAS are used, each address can cope even with both of non-multiplex/multiplex. An address-signal capturing configuration using the clock signals CLK and RAS and CAS referred to above is applicable even to the first through third modifications in a manner similar to the first embodiment.

Figure 31:
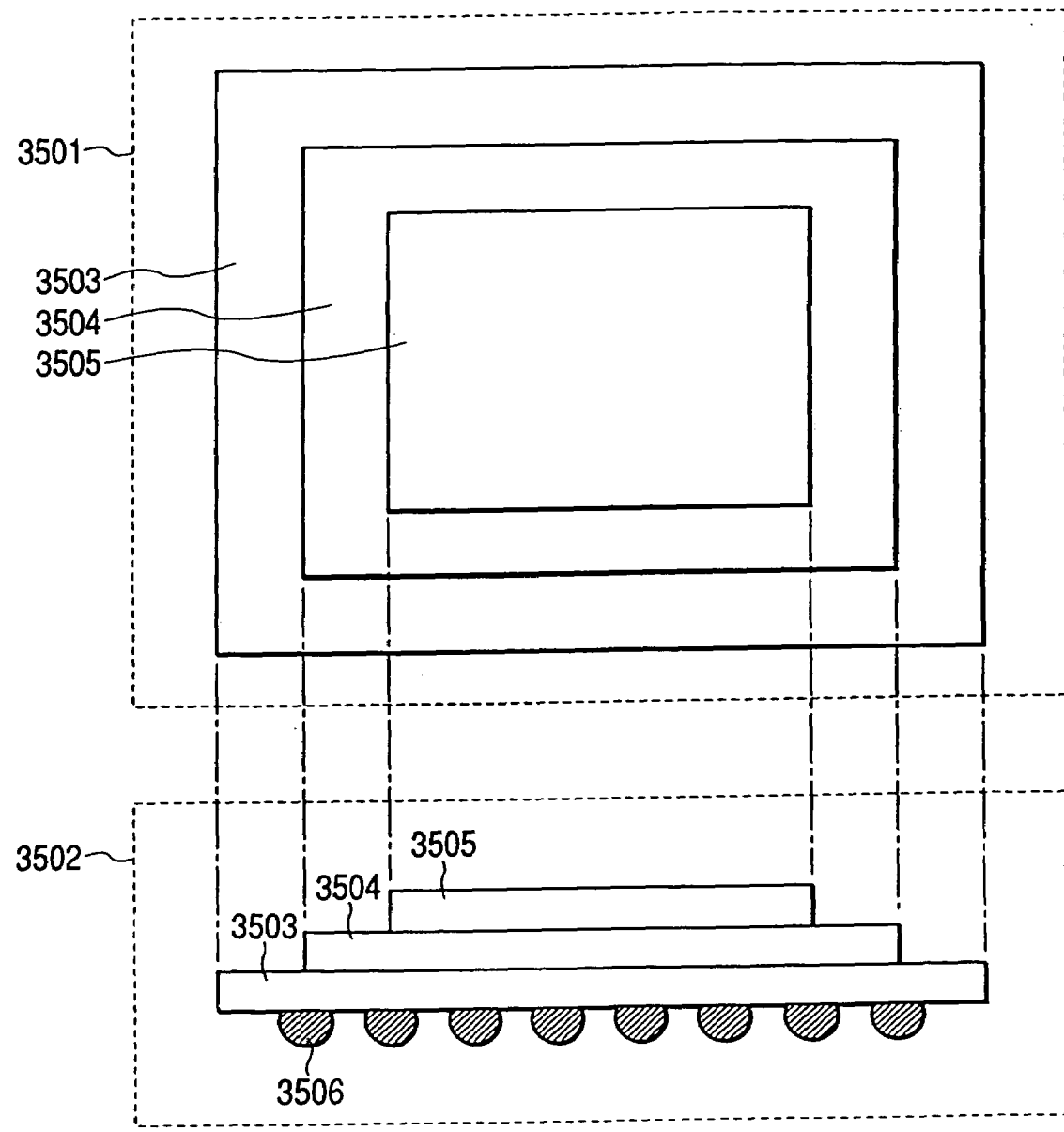
FIG. 31 is a configurational diagram for describing a form of packaging of one embodiment of a semiconductor memory device according to the present invention.

A configurational diagram for describing a form of packaging of one embodiment of a semiconductor memory device according to the present invention is shown in FIG. 31. The present embodiment is intended for a package form generally called a stacked CSP (Chip Size Package). Reference numeral 3501 indicates a configuration as viewed from above, and reference numerals 3502 indicates a configuration as viewed in a cross section.

The present embodiment includes a substrate 3503, a flash memory chip 3504 on the substrate 3503, a DRAM chip (complete pseudo static RAM) 3505 according to the present invention, on the flash memory chip 3504, which needs no refresh from outside and copes with high-speed sequential access, and solder balls 3506. However, bonding wires are omitted to avoid complication of the drawing.

In the above packaging, an address signal and an input/output data signal are connected to the same pin on the substrate with respect to the flash memory and the DRAM for realizing the present invention, which needs no refresh from outside and copes with the high-speed sequential access. Namely, they share the use of the same pin. On the other hand, command signals are respectively connected to different pins on the substrate with respect to the flash memory and the DRAM for realizing the present invention, which needs no refresh from outside and copes with the high-speed sequential access. In the system shown in FIG. 3, the two semiconductor chips 3504 and 3505 are brought into one semiconductor memory device to thereby make it possible to simplify and downsize the system integrated with a CPU or the like.

Figure 32:
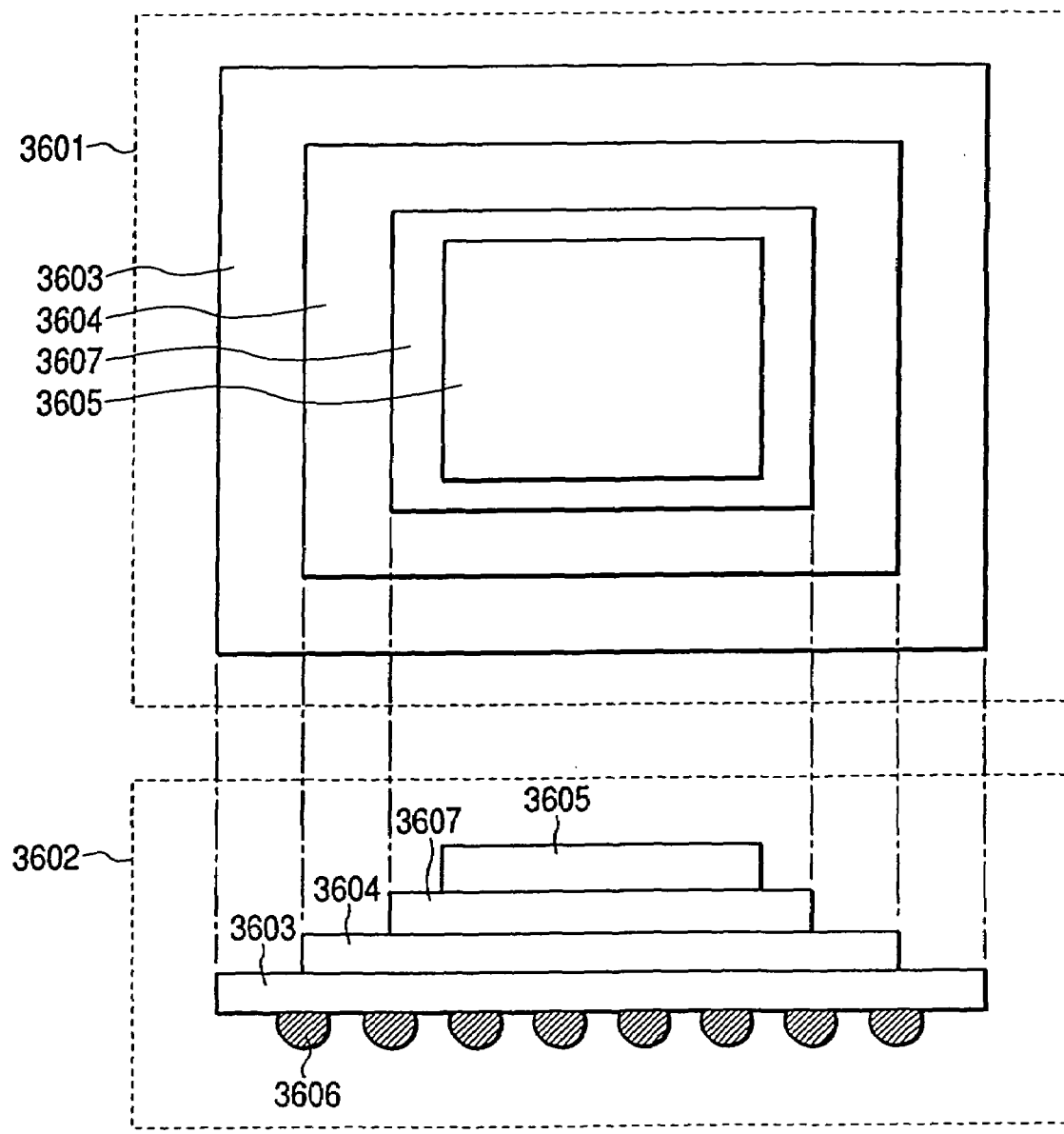
FIG. 32 is a configurational diagram for describing a form of packaging of another embodiment of a semiconductor memory device according to the present invention.

A configurational diagram for describing a form of packaging of another embodiment of a semiconductor memory device according to the present invention is shown in FIG. 32. The present embodiment is intended for a package form generally called a stacked CSP (Chip Size Package). Reference numeral 3601 indicates a configuration as viewed from above, and reference numeral 3602 indicates a configuration as viewed in a cross-section.

The present embodiment includes a substrate 3603, a flash memory chip 3604 on the substrate 3603, an SRAM chip 3607 on the flash memory chip 3604, a DRAM chip 3605 on the SRAM chip 3607, for realizing the present invention, which DRAM chip needs no refresh from outside and copes with a high-speed sequential access, and solder balls 3606. However, bonding wires are omitted to avoid complication of the drawing.

The SRAM chip 3607 and the DRAM chip 3605 for realizing the present invention, which needs no refresh from outside and copes with the high-speed sequential access, might be provided in reverse. Namely, the present embodiment has the substrate 3603, the flash memory chip 3604 on the substrate 3603, the DRAM chip 3605 on the flash memory chip 3604, for realizing the present invention, which DRAM chip needs no refresh from outside and copes with the high-speed sequential access, the SRAM chip 3607 on the DRAM chip 3605, for realizing the present invention, which SRAM chip needs no refresh from outside and copes with the high-speed sequential access, and the solder balls 3606.

In the above packaging, an address signal and an input/output data signal are connected to the same pin on the substrate with respect to the flash memory, the SRAM and the DRAM for realizing the present invention, which needs no refresh from outside and copes with the high-speed sequential access. Namely, they share the use of the same pin. On the other hand, command signals are respectively connected to different pins on the substrate with respect to the flash memory, the SRAM and the DRAM for realizing the present invention, which needs no refresh from outside and copes with the high-speed sequential access. While the signals are connected to the same pin on the substrate with respect to the SRAM and the DRAM for realizing the present invention, which needs no refresh from outside and copes with the high-speed sequential access, the signals might be respectively connected to different pins on the substrate with respect to the flash memory.

Operations and advantageous effects obtained from the above embodiments will be described as follows:

(1) An advantageous effect is obtained in that a pseudo static RAM having a time multiplex mode for, when instructions for a memory operation for reading memory information from or writing the same into each memory cell requiring a refresh operation for periodically holding the memory information is issued, carrying out an addressing-based autonomous refresh operation different from such a memory operation before or after the memory operation includes respective address signal transition detectors for a row and a column, and is provided with a page mode for independently performing a column address selecting operation according to an address signal transition detect signal of the column address signal transition detector, whereby the pseudo static RAM can be made identical in usability to a static RAM by using dynamic memory cells, and a high-speed memory cycle time can be realized.

(2) An advantageous effect is obtained in that a pseudo static RAM having a time multiplex mode for, when a memory operation for reading memory information from or writing the same into each memory cell requiring a refresh operation for periodically holding the memory information, and an addressing-based refresh operation different from the memory operation compete with each other, carrying out a refresh operation before or after the memory operation includes respective address signal transition detectors for a row and a column, and is provided with a page mode for independently performing a column address selecting operation according to an address signal transition detect signal of the column address signal transition detector, whereby the pseudo static RAM can be made identical in usability to a static RAM by using dynamic memory cells, and a high-speed memory cycle time can be realized.

(3) In addition to the above, an advantageous effect is obtained in that a judgement circuit is provided which detects earlier one between a request signal for the memory operation and a request signal for the refresh operation, and the memory operation and the refresh operation are arbitrated so as not to overlap on a time base according to a judgement output of the judgement circuit, whereby a reasonable memory operation excellent in usability can be realized.

(4) In addition to the above, an advantageous effect is obtained in that a preliminary operation for a word line selecting operation under the subsequently-executed operation of the memory operation and the refresh operation is carried out in parallel during the previously-executed operation of the memory operation and the refresh operation, whereby a memory cycle can be speeded up.

(5) In addition to the above, an advantageous effect is obtained in that the rising of a word line under the subsequently-executed operation of the memory operation and the refresh operation is set after a word line reset operation and a bit line precharge under the previously-executed operation of the memory operation and the refresh operation are completed, whereby the memory information stored in each dynamic memory cell can be maintained.

(6) In addition to the above, an advantageous effect is obtained in that an interrupt for the refresh operation is enabled in association with a refresh request after the elapse of a predetermined period during execution of the page mode, whereby the coexistence of the page mode and the refresh operation can be realized.

(7) In addition to the above, an advantageous effect is obtained in that a register having memory capacity corresponding to a plurality of data is provided with data inputted and outputted according to the memory operation as units, and the transfer of data between each of the memory cells and the register is performed according to the once-executed memory operation to read the data from the register or write the same therein in the page mode, thereby permitting the refresh operation therebetween, whereby the coexistence between the page mode and the refresh operation can be realized.

While the invention made above by the present inventors has been described specifically based on the embodiments, the invention of the present application is not limited to the embodiments. It is needless to say that various changes can be made thereto within the scope not departing from the substance thereof. For example, the memory array is divided into plural form in a bit line and a word line directions, and address selectors therefor may be provided in a plural form in association with the divided memory cell arrays. As to word lines and bit lines, the word lines may be ones which adopt a hierarchical word line system like a main word line and local word lines. The bit lines may also be ones which adopt a hierarchical bit line system like local bit lines and a main bit line or the like.

Namely, the memory cell array and the address selectors thereof can be configured by using a device structure and a circuit layout technology adopted for the known dynamic RAM. As in the case of this embodiment, a synchronous pseudo SRAM having refresh concealment+page mode, and refresh concealment+DRAM interface (address multi and RAS·CAS control) may also be configured.

With high functionality of electronic equipment such as a cellular phone, there has been a surge in demand for a large-capacity word RAM. While the work RAM is normally made up of an asynchronous SRAM, it is unfitted for an increase in capacity. Attention has been paid to a large-capacity DRAM as an alternative memory. However, it needs refresh and is bad in usability. A semiconductor memory device according to the present invention is capable of holding compatibility with an asynchronous SRAM and is configured integrally with the flash memory, whereby various memory operations can be put to full use according to a combination with the flash memory having a non-volatile information function at power-off. The present invention can widely be used as a semiconductor memory device capable of being handled equivalently to an SRAM from outside while utilizing the DRAM circuit in this way.

An advantageous effect obtained by a typical one of the inventions disclosed in the present application will be described in brief as follows: A pseudo static RAM having a time multiplex mode for, when instructions for a memory operation for reading memory information from or writing the same into each memory cell requiring a refresh operation for periodically holding the memory information is issued, carrying out an addressing-based autonomous refresh operation different from such a memory operation before or after the memory operation includes respective address signal transition detectors for a row and a column, and is provided with a page mode for independently performing a column address selecting operation according to an address signal transition detect signal of the column address signal transition detector, whereby the pseudo static RAM can be made identical in usability to a static RAM by using dynamic memory cells, and a high-speed memory cycle time can be realized.

What is claimed is:

1. A semiconductor memory device comprising:
  a plurality of word lines;
  a plurality of bit lines;
  a plurality of memory cells coupled to the plurality of word lines and the plurality of bit lines so that one memory cell is coupled to one word line and one bit lines, wherein the plurality of memory cells stores information therein and each of which needs a first operation to hold the information stored therein;
  a row address decoder which receives row address signals and which selects one of plurality of word lines in accordance with the row address signals;
  a row address transition detector which receives the row address signals to detect a transition of the row address signals;
  a column address decoder which receives column address signals (and which selects one of the plurality of bit lines in accordance with the column address signals;
  a column address transition detector which receives the column address signals to detect a transition of the column address signals; and
  a timer which instructs the first operation to the plurality of memory cells in accordance with information holding capability of the plurality of memory cells,
  wherein the column address transition detector instructs a second operation which selects bit lines continuously to the column address decoder when the row address signals are constant and the column address signals are changed, and
  wherein the first operation is executed autonomously before or after a memory operation which is a reading operation for outputting the information from the memory cells or a writing operation for inputting the information to the memory cells each of which are different from the first operation.

2. The semiconductor memory device according to claim 1,
  wherein the semiconductor memory device is a pseudo static random access memory, and
  wherein the memory cells are dynamic memory cells.

3. The semiconductor memory device according to claim 2,
  wherein the first operation is a refresh operation, and
  wherein the second operation is a page mode operation.

4. The semiconductor memory device according to claim 1, further comprising:
  a judgment circuit which detects an earlier one between a request signal for a memory operation which includes reading operation and the writing operation and a request signal for the first operation,
  wherein the judgment circuit arbitrates the memory operation and the first operation so as not to overlap on a time base according to a judgment output of the judgment circuit.

5. The semiconductor memory device according to claim 4,
  wherein a preliminary operation for word line selecting under a subsequently-executed operation of the memory operation and the first operation is executed in parallel during the previously-executed operation thereof.

6. The semiconductor memory device according to claim 4,
  wherein a rising of a word line under the subsequently-executed operation between the memory operation and the first operation is set after a word line reset operation and a bit line precharging operation under the previously-executed operation thereof are completed.

* * * * *